(12) United States Patent
Kume et al.

(10) Patent No.: US 8,759,212 B2
(45) Date of Patent: Jun. 24, 2014

(54) SEMICONDUCTOR DEVICE AND METHOD OF MANUFACTURING SEMICONDUCTOR DEVICE

(75) Inventors: Ippei Kume, Kanagawa (JP); Jun Kawahara, Kanagawa (JP); Naoya Furutake, Kanagawa (JP); Shinobu Saitou, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 188 days.

(21) Appl. No.: 13/101,569

(22) Filed: May 5, 2011

(65) Prior Publication Data

US 2011/0272813 A1    Nov. 10, 2011

(30) Foreign Application Priority Data

May 7, 2010    (JP) .................................. 2010-107698

(51) Int. Cl.
*H01L 21/4763* (2006.01)
*H01L 21/302* (2006.01)
*H01L 21/461* (2006.01)
*H01L 21/31* (2006.01)
*H01L 21/469* (2006.01)

(52) U.S. Cl.
USPC ........... 438/638; 438/623; 438/624; 438/725; 438/763; 438/780

(58) Field of Classification Search
USPC .................. 438/623, 624, 638, 725, 763, 780
See application file for complete search history.

(56) References Cited

U.S. PATENT DOCUMENTS

| | | | | |
|---|---|---|---|---|
| 3,398,173 A | * | 8/1968 | Goossens ...................... | 556/461 |
| 5,241,097 A | * | 8/1993 | Zupancic et al. ............. | 556/460 |
| 5,403,945 A | * | 4/1995 | Kishita et al. ................. | 556/460 |
| 5,412,135 A | * | 5/1995 | Fukuda et al. ................ | 556/448 |
| 5,914,420 A | * | 6/1999 | Buese et al. ................... | 556/448 |
| 6,068,884 A | * | 5/2000 | Rose et al. .................... | 438/762 |
| 6,160,150 A | * | 12/2000 | Krahnke et al. .............. | 556/451 |
| 6,432,839 B2 | * | 8/2002 | Maeda et al. ................. | 438/758 |

(Continued)

FOREIGN PATENT DOCUMENTS

| | | |
|---|---|---|
| CN | 1682356 | 10/2005 |
| JP | 07-022393 | 1/1995 |

(Continued)

OTHER PUBLICATIONS

Ueki et al., "High Performance Cu Interconnects with Damage-less Full Molecular-Pore-Stack (MPS) SiOCH for 32nm-node LSIs and Beyond" pp. 619-622, (2008)LSI Fundamental Redearch Lab, and Advanced Device Development Div.

(Continued)

*Primary Examiner* — David Zarneke
(74) *Attorney, Agent, or Firm* — Young & Thompson

(57) ABSTRACT

A method of manufacturing a semiconductor device includes: forming a cap insulating film, including Si and C, on a substrate; forming an organic silica film, having a composition ratio of the number of carbon atoms to the number of silicon atoms higher than that of the cap insulating film, on the cap insulating film; and forming two or more concave portions, having different opening diameters, in the organic silica film, by plasma processing in which mixed gas including inert gas, N-containing gas, fluorocarbon gas and oxidant gas is used.

15 Claims, 15 Drawing Sheets

(56) References Cited

U.S. PATENT DOCUMENTS

| | | | |
|---|---|---|---|
| 6,448,175 B1* | 9/2002 | Kobayashi et al. | 438/637 |
| 6,479,391 B2* | 11/2002 | Morrow et al. | 438/706 |
| 6,541,398 B2* | 4/2003 | Grill et al. | 438/780 |
| 6,572,923 B2* | 6/2003 | Ma et al. | 427/255.27 |
| 6,653,719 B2* | 11/2003 | Matsuki | 257/642 |
| 6,730,594 B2* | 5/2004 | Noguchi et al. | 438/653 |
| 6,982,200 B2* | 1/2006 | Noguchi et al. | 438/253 |
| 7,053,487 B2* | 5/2006 | Saito et al. | 257/750 |
| 7,270,849 B2 | 9/2007 | Hayashi | |
| 7,285,853 B2* | 10/2007 | Liu | 257/734 |
| 7,504,343 B2* | 3/2009 | Hayakawa et al. | 438/778 |
| 7,622,808 B2* | 11/2009 | Ohtake et al. | 257/760 |
| 7,737,023 B2* | 6/2010 | Uno et al. | 438/623 |
| 7,799,693 B2* | 9/2010 | Soda | 438/709 |
| 7,868,407 B2* | 1/2011 | Ogihara et al. | 257/437 |
| 8,043,957 B2* | 10/2011 | Tada et al. | 438/622 |
| 8,080,878 B2* | 12/2011 | Ueki et al. | 257/759 |
| 8,278,763 B2* | 10/2012 | Tada et al. | 257/774 |
| 8,492,266 B2* | 7/2013 | Ueki et al. | 438/622 |
| 8,606,207 B2* | 12/2013 | Alexopoulos et al. | 455/307 |
| 2002/0061654 A1* | 5/2002 | Kanegae et al. | 438/710 |
| 2003/0109129 A1* | 6/2003 | Saito et al. | 438/627 |
| 2003/0162410 A1* | 8/2003 | Huang et al. | 438/780 |
| 2003/0203614 A1* | 10/2003 | Rajagopalan et al. | 438/622 |
| 2004/0152334 A1* | 8/2004 | Ohto et al. | 438/758 |
| 2004/0227242 A1* | 11/2004 | Noguchi et al. | 257/751 |
| 2005/0186801 A1 | 8/2005 | Uno et al. | |
| 2006/0131754 A1* | 6/2006 | Ohtake et al. | 257/760 |
| 2006/0183346 A1* | 8/2006 | Liu | 438/778 |
| 2006/0226516 A1* | 10/2006 | Goodner et al. | 257/632 |
| 2007/0128886 A1* | 6/2007 | Ogihara et al. | 438/780 |
| 2007/0157884 A1 | 7/2007 | Hayashi | |
| 2007/0161257 A1* | 7/2007 | Hyodo et al. | 438/780 |
| 2007/0264817 A1 | 11/2007 | Iijima | |
| 2009/0011592 A1* | 1/2009 | Uno et al. | 438/623 |
| 2009/0111275 A1 | 4/2009 | Hoshi et al. | |
| 2010/0059887 A1 | 3/2010 | Ueki et al. | |
| 2010/0087062 A1* | 4/2010 | Lakshmanan et al. | 438/675 |
| 2010/0123223 A1* | 5/2010 | Ito et al. | 257/632 |
| 2011/0092077 A1* | 4/2011 | Xu et al. | 438/763 |
| 2011/0237085 A1* | 9/2011 | Schmitt et al. | 438/763 |
| 2012/0007257 A1* | 1/2012 | Nomura | 257/774 |

FOREIGN PATENT DOCUMENTS

| | | |
|---|---|---|
| JP | 2007-318124 | 12/2007 |
| JP | 2008-177596 | 7/2008 |
| JP | 2009-105272 | 5/2009 |
| JP | 2010-93235 | 4/2010 |
| WO | WO 2007/132879 | 11/2007 |
| WO | WO 2007/142172 | 12/2007 |

OTHER PUBLICATIONS

Japanese Office Action dated Oct. 22, 2013 in corresponding Japanese Patent Application No. 2010-107698 with English translation of Japanese Office Action.

CN Office Action dated Apr. 27, 2013, with English translation; Application No. 201110120262.8.

Yoshihiro Hayashi et al., "Comprehensive Chemistry Designs in Porous SiOCH Film Stacks and Plasma Etching Gases for Damageless Cu Interconnects in Advanced ULSI Devices", IEEE Transactions on Semiconductor Manufacturing, vol. 21, No. 3, Aug. 31, 2008.

Chinese Official Action—201110120262.8—Jan. 8, 2014.

* cited by examiner

FIG. 15A
FIG. 15B
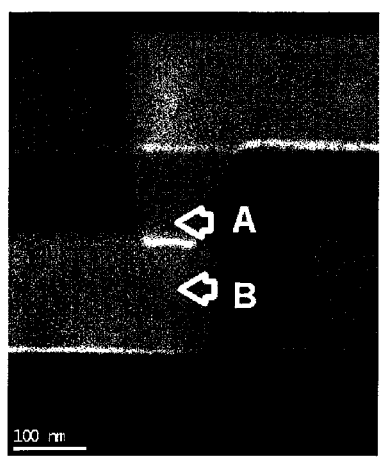
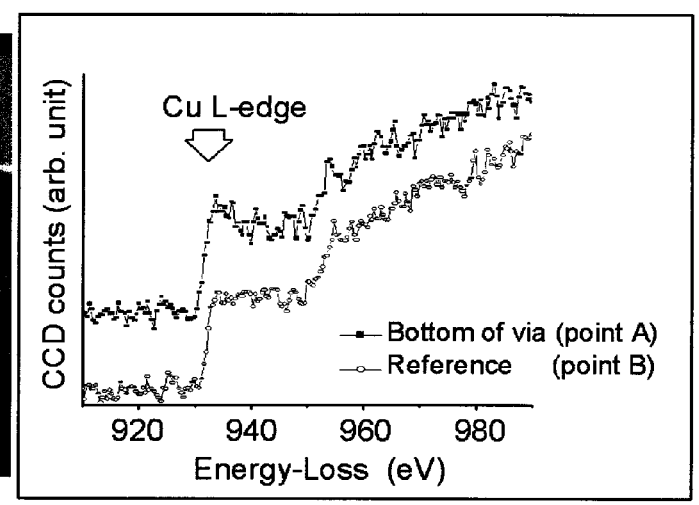

SEMICONDUCTOR DEVICE AND METHOD OF MANUFACTURING SEMICONDUCTOR DEVICE

The application is based on Japanese patent application No. 2010-107698, the content of which is incorporated herein by reference.

BACKGROUND

1. Technical Field

The present invention relates to a semiconductor device and a method of manufacturing a semiconductor device.

2. Related Art

In recent years, as miniaturization of LSIs has progressed, insulating films having a low specific dielectric constant have been chiefly used as interconnect insulating interlayers. In addition, cap insulating films which are etching stoppers have been thinned for the purpose of the low-dielectric constant. Thereby, the etching stop property remarkably decreases in a process of forming via interconnects. Further, it is required to introduce slit-shaped vias having a large opening diameter in order to reduce the via resistance. For this reason, in LSI interconnects in the future, there will be increased importance for a technique for simultaneously processing a normal via and a slit-shaped via having a larger diameter than that of the via.

Such a technique for forming slit-shaped via patterns having different opening diameters is disclosed in, for example, Japanese Unexamined Patent Publication 2007-318124.

Japanese Unexamined Patent Publication 2007-318124 discloses that in an insulating interlayer of SiCOH provided on a cap insulating film of SiCN, an etching stopper in the slit-shaped via pattern portion having a large opening diameter is partially thickened. Thereby, it is disclosed that variation in the depth between vias can be suppressed by increasing the etching stop property. In addition, gaseous species are not disclosed in Japanese Unexamined Patent Publication 2007-318124.

Meanwhile, Japanese Unexamined Patent Publication 2009-105272 discloses a technique for controlling the etching rate of trenches having different aspect ratios. That is, Japanese Unexamined Patent Publication 2009-105272 discloses that the trench is formed in a CF-based insulating interlayer provided on a cap insulating film such as SiC, by combination use of hydrogen-containing gas such as $CH_3F$ gas and $N_2$ gas. In the trench forming process, in a via hole having a small aspect ratio, a deposit is deposited at the bottom.

On the other hand, in a via hole having a high aspect ratio, a deposit is not deposited at the bottom. For this reason, it is disclosed that in the via hole having a small aspect ratio, the etching rate can be reduced by the deposit.

On the other hand, a technique for improving the etching stop property of the cap insulating film is disclosed in, for example, Japanese Unexamined Patent Publication 2008-177596. In Japanese Unexamined Patent Publication 2008-177596, plasma processing is performed on the insulating interlayer of $(HO)_3SiCH_3$ provided on the cap insulating film of SiN, by replacing $O_2$ gas with $N_2$ gas in mixed gas of CF gas/$O_2$ gas/Ar gas. It is disclosed that since the $N_2$ gas cannot chemically etch a CF-based deposited film, the drawing-out phenomenon of $CH_3$ of the insulating interlayer in which the CF-based deposited film exists does not occur. Thereby, it is disclosed that the selectivity to SiN is raised while the generation of a sub-trench is suppressed.

In addition, M. Ueki, IEEE, pp 619-622 (2008) discloses that etching damage can be suppressed using a high carbon-containing organic silica film. As shown in M. Ueki, IEEE, pp 619-622 (2008), the carbon content of this high carbon-containing organic silica film is higher than the carbon content of a porous SiOCH film generally widely used as shown in Japanese Unexamined Patent Publication 2007-318124.

SUMMARY

However, it is required to select proper gas as gaseous species in order not to cut down the cap insulating film. In addition, the insulating interlayer needs a low-dielectric constant film, and various types of films exist. For this reason, considering the selectivity of the cap insulating film, it is required to change applied gaseous species in the case of changing materials of the insulating interlayer or the combination thereof.

In one embodiment, there is provided a method of manufacturing a semiconductor device, including: forming an insulating film, including Si and C, over a substrate; forming an organic silica film, having a composition ratio of the number of carbon atoms to the number of silicon atoms higher than that of the insulating film, over the insulating film; and forming two or more concave portions, having different opening diameters, in the organic silica film, by plasma processing in which mixed gas including inert gas, N-containing gas, fluorocarbon gas and oxidant gas is used.

According to the invention, it is possible to provide a semiconductor device obtained by the above-mentioned method of manufacturing a semiconductor device.

N in the N-containing gas reacts with carbon when excited. In the invention, the carbon content of the organic silica film is caused to increase, while the carbon content of the insulating film is caused to decrease. Thereby, it is possible to decrease the etching rate of carbon of the insulating film while increasing the etching rate of carbon of the organic silica film. In this manner, it is possible to improve the etching selectivity by the N-containing gas. It is possible to suppress variation in the depth between the vias having different opening diameters by improving the etching selectivity.

In another embodiment, there is provided a semiconductor device including: a substrate; an insulating interlayer provided over the substrate; a first metal film which is provided with a plurality of interconnect trenches within the insulating interlayer, and is buried in the interconnect trenches, respectively; an insulating film, provided over the insulating interlayer, that includes Si and C; an organic silica film, provided over the insulating film, that has a composition ratio of the number of carbon atoms to the number of silicon atoms higher than that of the insulating film; and a second metal film which is provided with a first concave portion and a second concave portion having a larger opening diameter than that of the first concave portion in the organic silica film, and is buried in the first concave portion and the second concave portion, respectively, wherein the second metal film and the first metal film are electrically connected to each other, and wherein in the surface of the first metal film between the second metal film buried in the first concave portion and the second concave portion, respectively, and the first metal film, a peak equivalent to an oxide of metal included in the first metal film does not exist when measured by a transmission electron microscope and electron energy loss spectroscopy.

In the semiconductor device according to the invention, it is configured so that the carbon content of the organic silica film is high, while the carbon content of the insulating film is low. For this reason, in the process of manufacturing a semiconductor device, as mentioned above, it is possible to suppress variation in the depth between the vias having different opening diameters by improving the etching selectivity. As a result, it is possible to suppress variation in the remaining film thickness of the insulating film in the first concave portion and the second concave portion, and to protect the surface of the first metal film from being oxidized when the concave portion is formed. For this reason, it is configured so that in the surface of the first metal film, the oxide of metal included in the first metal film does not substantially exist.

According to the invention, it is possible to suppress variation of the depth of the via, and to realize the structure of the semiconductor device having an excellent reliability and a method of manufacturing the same.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 15A and 15B are diagrams illustrating composition constituents in the surface and the inside of a copper interconnect under a via hole.

DETAILED DESCRIPTION

Figure 1:
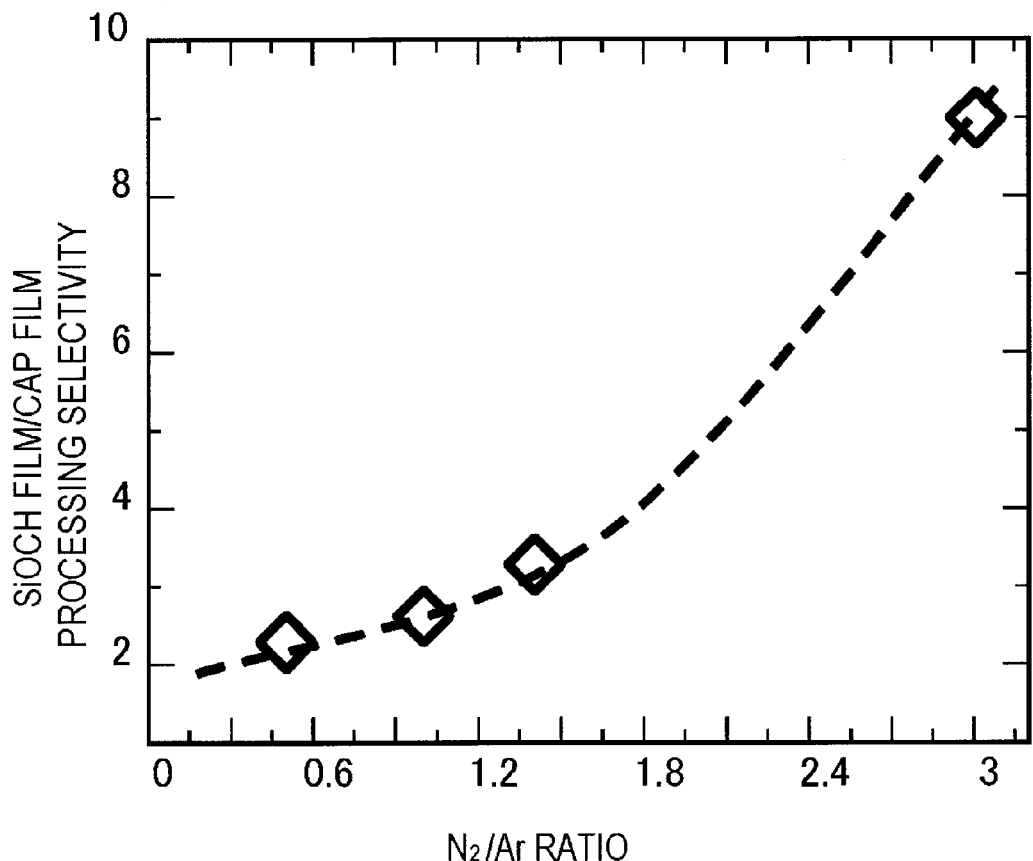
FIG. 1 is a diagram illustrating the relationship between the etching selectivity and the $N_2/Ar$ ratio.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

(Semiconductor Device)

Figure 9A:
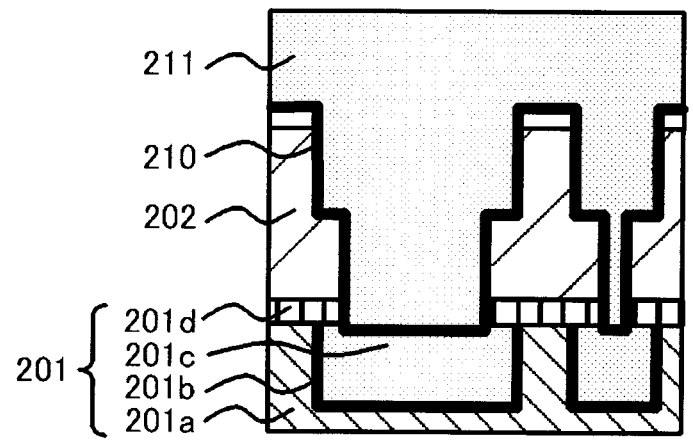
FIGS. 9A to 9C are cross-sectional views illustrating the process of manufacturing the semiconductor device according to the embodiment of the invention.
Figure 9B:
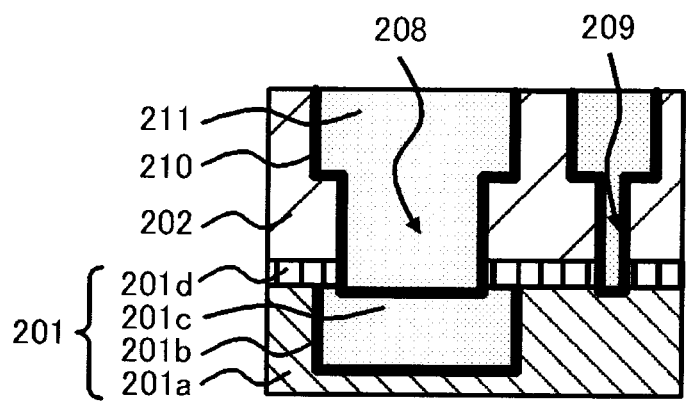
Figure 9C:
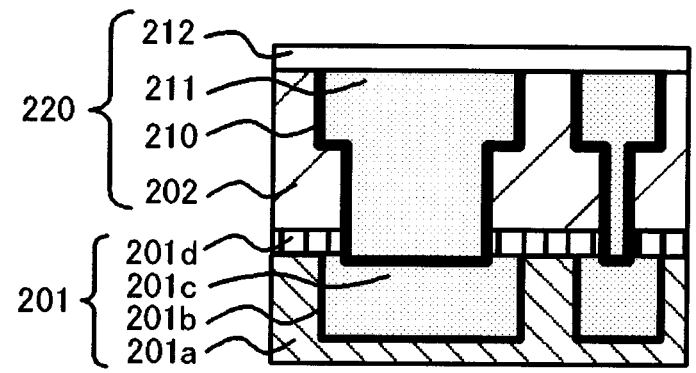

FIG. 9C is a schematic cross-sectional view illustrating a semiconductor device according to the embodiment.

The semiconductor device according to the embodiment includes a substrate (silicon substrate), a lower-layer interconnect structure 201, an organic silica film 202 which is provided on a cap insulating film 201d including Si and C in the lower-layer interconnect structure 201 and has a composition ratio of the number of carbon atoms to the number of silicon atoms higher than that of the cap insulating film 201d (hereinafter, referred to as C/Si), and a second metal film (Cu film 211) which is provided with a first concave portion (opening 208) and a second concave portion (opening 209) within the organic silica film 202 and is buried in these openings.

The opening diameters (or opening areas) of the opening 208 and the opening 209 are different from each other. For example, the opening diameter of the opening 208 is larger than that of the opening 209. The interface composition of the Cu film 211 and a Cu film 201c (first metal film) in the opening 208 and the interface composition of the Cu film 211 and the Cu film 201c in the opening 209 are homogeneous without depending on the opening ratio (however, when a barrier metal film 210 is formed at the bottom of the Cu film 211, the interface composition of the barrier metal film 210 and the Cu film 201c is configured to be homogeneous). For this reason, in the surface of the Cu film 201c between the Cu film 211 and the Cu film 201c in each of the opening 208 and the opening 209, an oxide (CuO) of metal (Cu) included in the Cu film 201c may not substantially exist.

Here, the fact that the oxide (CuO) does not substantially exist means that the peak equivalent to the oxide (CuO), which protrudes further than the peak of metal (Cu) included in the Cu film 201c measured by a transmission electron microscope and an electron energy loss spectroscopy (TEM-EELS), does not exist in the surface of the Cu film 201c between the Cu film 211 and the Cu film 201c in each of the opening 208 and the opening 209.

As shown in FIG. 9C, the semiconductor device according to the embodiment includes a multilayer interconnect layer, formed on a semiconductor substrate (silicon substrate), not shown in the drawing, in which a plurality of interconnect layers constituted by an interconnect (copper interconnect) and an insulating layer (insulating interlayer) is laminated. A plurality of interconnect trenches is formed in an organic silica film 201a and the organic silica film 202 (first insulating interlayer and second insulating interlayer), respectively. The Cu film 201c and Cu film 211 (first metal interconnect and second metal interconnect) are buried in each of the interconnect trenches. The first metal interconnect (Cu film 201c) and the second metal interconnect (Cu film 211) are electrically connected to each other. The Cu film 211 may have a dual damascene structure, and may have a single damascene structure. In addition, the line-shaped Cu film 211 and the via-shaped (columnar) Cu film 211 are formed in an upper-layer interconnect structure 220. The opening diameters (or opening areas) of each of the Cu films 211 are different from each other. A barrier metal film 201b and the barrier metal film 210 are formed within each of the interconnect trenches so as to cover the Cu film 201c and the Cu film 211. The cap insulating film 201d is formed between the organic silica film 201a and the organic silica film 202. On the other hand, a cap insulating film 212 is formed on the organic silica film 202 and on the Cu film 211.

There is sufficient processing controllability in the semiconductor device of the embodiment, when a Cu multilayer interconnect having a plurality of slit-shaped via patterns of which the opening diameters (opening areas) are different is collectively formed. The interface composition of the lower-layer interconnect in this opening is homogeneous without depending on the opening ratio. For this reason, in the semiconductor device of the embodiment, it is possible to obtain a multilayer copper interconnect which does not inhibit a device performance influenced by the manufacturing process. Therefore, in the embodiment, it is possible to obtain the semiconductor device having a high reliability.

Next, a manufacturing method according to the embodiment will be described.

The method of manufacturing the semiconductor device according to the embodiment includes: forming the cap insulating film 201d including Si and C over the substrate; forming the organic silica film 202, having a composition ratio of the number of carbon atoms to the number of silicon atoms higher than that of the cap insulating film 201d, on the cap insulating film 201d; forming two or more concave portions (opening 208 and opening 209), having different opening diameters, in the organic silica film 202, by plasma processing in which mixed gas including inert gas, N-containing gas, fluorocarbon gas and oxidant gas is used.

The inventor has found that highly-selective etching of the organic silica film/cap insulating film is possible using the high carbon content of the organic silica film. Thereby, in the embodiment, it is possible to realize the multilayer interconnect having a high processing controllability.

As an example of the collective formation of the vias according to the embodiment, Ar is used as inert gas, $N_2$ is used as N-containing gas (reaction accelerating gas), $CF_4$ is used as fluorocarbon gas, and $O_2$ is used as oxidant gas. In addition, using a SiOCH film as the organic silica film and using a SiC film as the cap insulating film, (C/Si) of the organic silica film to the cap insulating film is set to 1 or greater. In addition, a line-shaped via and a via hole having an opening diameter smaller than that of the line-shaped via are used as the via.

FIG. 1 is a diagram illustrating the relationship between the etching selectivity of the organic silica film to the cap insulating film and the $N_2$/Ar ratio.

As shown in FIG. 1, when the flow rate of $N_2$ gas increases, the etching selectivity of the organic silica film to the cap insulating film (hereinafter, simply referred to as the etching selectivity) increases. Further, in terms of the basis of inert gas, when the $N_2$/Ar ratio increases, the etching selectivity also increases.

Such a point will be described. First, when N in the $N_2$ gas is excited, it reacts with C in the organic silica film. The carbon content of the organic silica film is caused to increase, while the carbon content of the cap insulating film is caused to decrease. Thereby, the etching rate of the organic silica film increases, while the etching rate of the cap insulating film decreases. For this reason, the above-mentioned etching selectivity can become higher.

In addition, since $N_2$ is an element which is easily ionized, and has an atomic number smaller than that of Ar and has a small amount of ion bombardment, the formation of a sub-trench can be suppressed even when the element is used in highly ionic etching. For this reason, it is possible to realize etching having a high processing uniformity.

The $N_2$/Ar ratio is not particularly limited, but it is preferably 1 or greater, more preferably 1.5 or greater.

As stated above, when the $N_2$ gas is used, the etching selectivity can be improved in the organic silica film having a carbon content higher than that of the cap insulating film. This is not limited to the $N_2$ gas, but is the same in the N-containing gas. It is possible to suppress variation in the depth between the vias having different opening diameters by improving the etching selectivity.

Therefore, it is possible to improve the etching selectivity through the N-containing gas by setting (C/Si) of the organic silica film to the cap insulating film to 1 or greater, more preferably 2 or greater.

Figure 2:
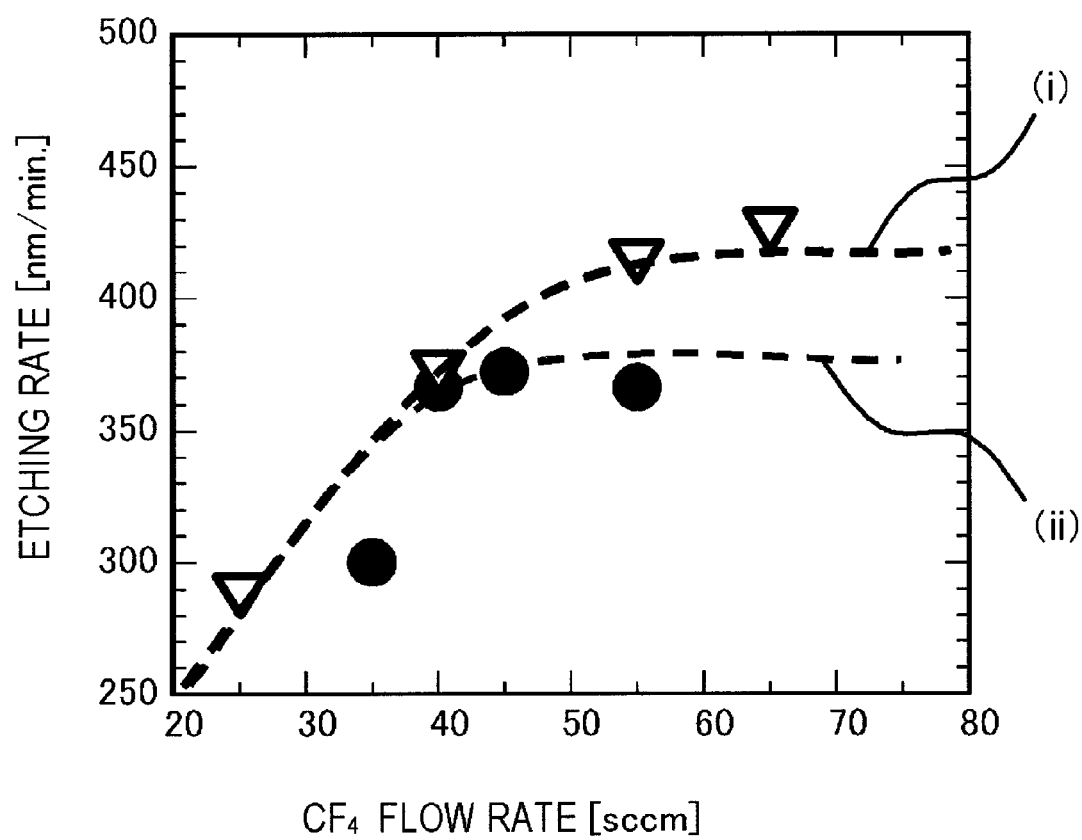
FIG. 2 is a diagram illustrating the relationship between the etching rate and the flow rate of $CF_4$.

In addition, FIG. 2 shows the relationship between the etching rate and the flow rate of $CF_4$. Here, (i) in FIG. 2 denotes the etching rate in the case of the condition that the flow rate of $O_2$ gas is 15 sccm, while (ii) denotes the etching rate in the case of the condition that the flow rate of the $O_2$ gas is 10 sccm.

As shown in FIG. 2, in the etching of the organic silica film having a C/Si ratio of 1 or greater, when the flow rate of $CF_4$ is a predetermined value or more, the etching rate is saturated, and thus becomes constant. Further, in terms of the basis of the $O_2$ gas, when the $CF_4/O_2$ ratio is a predetermined value or more, the etching rate is saturated, and thus becomes constant. It is known from FIG. 2 that when the $CF_4/O_2$ ratio is 4 or greater, the etching rate is saturated, and thus becomes constant.

Therefore, when etching is performed at such a $CF_4/O_2$ ratio, the etching rate can become constant without depending on the opening diameter (or opening area) between the vias, thereby allowing the depths of the vias to be made equal between the vias having different opening diameters.

In addition, the $CF_4/O_2$ ratio at which the etching rate can become constant (hereinafter, referred to as the saturated $CF_4/O_2$ ratio) is determined by the C/Si ratio, and as C increases, the saturated $CF_4/O_2$ ratio become smaller. In addition, the flow rate of $CF_4$ at which the etching rate can become constant (hereinafter, referred to as the saturated $CF_4$ flow rate) is determined by the C/Si ratio, and as C increases, the saturated $CF_4$ flow rate becomes smaller.

In the embodiment, the $CF_4/O_2$ ratio is preferably equal to or greater than 1.0 and equal to or less than 5.0. It is possible to suppress variation in the etching rate by setting the $CF_4/O_2$ ratio to the lower limit or greater. On the other hand, the etching selectivity is improved by setting the ratio to the upper limit or less, and thus the excellent processing controllability is obtained.

Therefore, it is possible to improve the etching selectivity through the fluorocarbon gas by setting (C/Si) of the organic silica film to the cap insulating film to 1 or greater, more preferably 2 or greater.

In addition, since the high carbon-containing organic silica film has a C/Si ratio higher than that of the cap insulating film (etching stopper), the etching stop property reach the maximum level at the side where the $CF_4/O_2$ ratio is low.

A supplementary description of this point will be made. When the flow rate of $CF_4$ becomes low, the etching rate of Si becomes low. In the embodiment, the Si content is small in the organic silica film, and is large in the cap insulating film. For this reason, the etching rate of the cap insulating film becomes low. Thereby, the etching selectivity can be improved.

In addition, prevailing removal of Si by a CFx radical is a main cause for occurrence of the difference between patterns. However, in the embodiment, when the flow rate of $CF_4$ (CFx radical) is made higher than the flow rate of saturated $CF_4$ in the saturated $CF_4/O_2$ ratio, the etching rate becomes constant. Therefore, even when the amount of CFx radical supply changes with the opening diameter, the etching rate can not change. That is, the etching rates between the vias having different opening diameters can be made equal. For this reason, the difference between patterns of the etching rates can be solved.

In addition, when the flow rate of $CF_4$ is higher than the flow rate of saturated $CF_4$ of the saturated $CF_4/O_2$ ratio, in via processing, the slit-shaped vias can be simultaneously opened without depending on the opening diameter and the opening area. For this reason, after the cap is opened, the amounts of overetching to the Cu interconnect in the slit-shaped via portion are made equal. Oxidation of the Cu surface due to the influence of overetching or the etching product to be attached, and the degree of the Cu deformation amount and the like can be made equal without depending on the opening diameter and the opening area. For this reason, the cleaning effect by chemical processing is also the same in all slit-shaped vias, and the interface composition of the via and the lower-layer Cu interconnect and the shape thereof are homogeneous in the in-plane of the wafer. In the embodiment, since the composition or the shape of the interface between the via and the Cu interconnect can be homogeneously controlled, variation in the via resistance can be reduced, and via reliability can also be improved.

Moreover, in highly ionic etching, the bond is broken by the ion bombardment, and the etching is accelerated. However, since the high carbon-containing organic silica film of which the C/Si ratio is greater than 1 is formed of CH—* (* is Si or C) having a relatively weak bond similarly to the cap insulating film, and the strong Si—O bond is scarce, the etching rate can decrease instead in the high Ar flow rate. That is, in the etching of the high carbon-containing organic silica film, the sub-trench shape can be scarcely formed even by the high Ar flow rate etching. In addition, even when $N_2$ is used as a gas replacing Ar, the etching rate can ba made constant by the saturated $CF_4/O_2$ ratio without depending on the supply of N ions, and thus similarly, the sub-trench shape is hardly formed. For this reason, in the etching of the high carbon-containing organic silica film, the highly ionic etching through the high Ar flow rate and the high $N_2$ flow rate is possible. Particularly, when the $N_2$/Ar ratio is 1 or greater, the processing selectivity of the high carbon-containing organic silica film and the cap insulating film is improved.

In addition, mixed gas having a $N_2$/Ar ratio of 1 or greater and a $CF_4/O_2$ ratio of 5 or less is used, whereby it is possible to realize the etching stop property of the cap insulating film while the difference between patterns of the slit-shaped via patterns having different opening diameters is suppressed. In this manner, the inventor has found that with respect to the high carbon-containing organic silica film, the etching rate of the organic silica film between the vias having different opening diameters can be made constant by the $CF_4/O_2$ ratio above a certain value, in the etching in which physical properties having a small effect of improvement in the etching rate by the ion bombardment are used.

Thereby, variation in the depth of the via can be suppressed between the vias having different opening diameters. In addition, since the remaining film of the etched insulating film just below the via can be made equal between the vias, the interface composition of the lower-layer interconnect in each of the openings can become homogeneous without depending on the opening ratio.

Hereinafter, components of each gas or materials of the organic silica film according to the embodiment will be described in detail.

As the N-containing gas, nitrogen gas, ammonia gas, a primary amine gas, a secondary amine gas, a tertiary amine gas, or quaternary ammonium and the like can be used (however, oxidant gas is excluded). When these gases are excited in plasma, they serve as reaction accelerating gases which react with C in the organic silica film.

As the inert gas, for example, gases such as helium, neon, argon, krypton, xenon, and radon can be used (however, nitrogen-containing gas is excluded).

As the fluorocarbon gas, gas represented by CxHyFz can be used (x and z are respectively the same or different natural numbers, and y is zero or a natural number). In particular, the gas includes $CF_4$, $CHF_3$, $CH_2F_2$, $CHF_3$, $C_2F_6$, $C_2H_2F_4$, $C_2H_4F_2$, $C_2F_4$, $C_2H_2F_2$, $C_3F_8$, $C_3H_2F_6$, $C_3H_4F_4$, $C_3H_6F_2$, $C_3F_6$, $C_3HF_5$, $C_3H_3F_3$, $C_3H_4F_2$ or $C_3H_5F$ and the like.

As the oxidant gas, gas such as $O_2$, $CO_2$, $CH_3OH$, $C_2H_5OH$, $C_3H_7OH$, $N_2O$, $NO$, $N_2O_3$, $NO_2$, $N_2O_4$ or $N_2O_5$ can be used.

The cap insulating film is a film made of any of silicon carbide (SiC) and silicon nitride carbide (SiCN), or a laminated film thereof. In addition, the cap insulating film is a film made of oxygen-containing silicon carbide (SiCON) including unsaturated hydrocarbon, amorphous carbon and oxygen, or a laminated film of SiCN, SiC and the oxygen-containing silicon carbide film. In addition, the C/Si ratio of the cap insulating film is preferably 1.0 to 1.5.

The organic silica film according to the embodiment is a porous SiOCH film. This porous SiOCH film includes cyclic organosiloxane.

The cyclic organosiloxane has a cyclic siloxane structure, and has a hydrocarbon group at the side chain thereof.

When Si—O (siloxane bond) is counted as one unit, the cyclic siloxane has a cyclic structure composed of a plurality of units. This cyclic siloxane has a cyclic structure in which the same number of silicon (Si) atoms and oxygen (O) atoms is alternately linked. The cyclic structure includes, for example, a three-membered ring, a four-membered ring, and a five-membered ring (herein, Si—O (siloxane bond) is counted as one unit). As the cyclic structure, the three-membered ring having a small vacancy diameter is preferable from the viewpoint of process stability.

In addition, the porous SiOCH film includes independent vacancies in which the individual vacancies are not connected to each other. Here, the formation mechanism of the vacancy of the porous SiOCH film will be described. The origin of the vacancy in the porous SiOCH film is a cyclic siloxane skeleton. For this reason, the porous SiOCH film is made porous by the independent vacancies in which the individual vacancies are not connected to each other. In other words, in the embodiment, a process of desorbing porogen to make a film porous is not required. Therefore, in the porous SiOCH film according to the embodiment, continuous vacancies caused by desorption are not formed.

The organic silica film is obtained by using a cyclic organosiloxane compound having a structure represented by the following Formula (1). For example, the organic silica film is obtained by a plasma polymerization method. Thereby, the porous SiOCH film having a small vacancy diameter is formed.

[Formula 1]

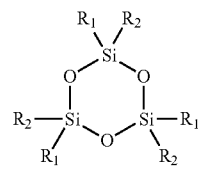

(1)

In Formula (1), R1 and R2 are the same or different, and denote a hydrocarbon group, respectively. The hydrocarbon group includes a linear or branched alkyl group, a cyclic alkyl group, an alkenyl group and the like.

The alkyl group is, for example, an alkyl group having a carbon number in the range of 1 to 8. An example of the alkyl group includes a methyl group, an ethyl group, a propyl group, an isopropyl group, a butyl group and the like.

The alkenyl group is, for example, an alkenyl group having a carbon number in the range of 1 to 8. An example of the alkenyl group includes a vinyl group, an allyl group and the like.

A compound having a cyclic organosiloxane structure may be configured such that R1 is an unsaturated hydrocarbon group and R2 is a saturated hydrocarbon group. In this case, it is possible to grow a low-dielectric constant insulating film in which the cyclic siloxane is bonded by a plasma polymerization reaction of the unsaturated hydrocarbon group of R1. In particular, it may be configured to be a compound having, for example, an isopropyl group (cyclic organosiloxane structure represented by the following Formula (3)), where R1 is a vinyl group and R2 is a saturated hydrocarbon group having a branched structure with large steric hindrance. It is preferable because a large steric hindrance of the side chain R2 can reduce the density of the film, and can reduce the specific dielectric constant. Meanwhile, it is obvious that the saturated hydrocarbon (R2) having a branched structure with large steric hindrance includes isobutyl, tertiary butyl and the like.

Particularly, the cyclic organic silica compound having a cyclic siloxane structure preferably includes both the hydrocarbon group having a carbon number of at least 3 or more and the unsaturated hydrocarbon group. In this manner, the siloxane structure includes both the unsaturated hydrocarbon group and the hydrocarbon group having the number of carbon atoms of 3 or more, whereby it is possible to form the organic silica film in which the decarbonizing rate is decreased by the strong bond energy of the unsaturated hydrocarbon group, many hydrocarbon constituents are held by the hydrocarbon group having a large number of carbon atoms, and the carbon composition is enriched.

In addition, the organic silica film can be formed by a plasma CVD method, using a compound having a cyclic organosiloxane structure shown in the following Formula (2) or (3) as a material. At this time, the organic silica film can have a small vacancy structure with an average vacancy diameter of less than 1 nm, for example, 0.3 to 0.7 nm.

The average vacancy diameter can be measured by a small-angle X-ray scattering method or a positron annihilation method, a high-resolution electron microscope observation and the like.

[Formula 2]

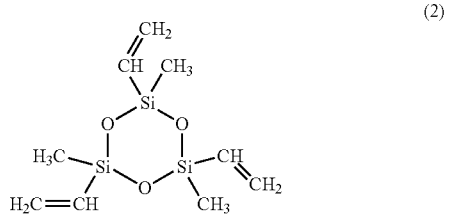

(2)

[Formula 3]

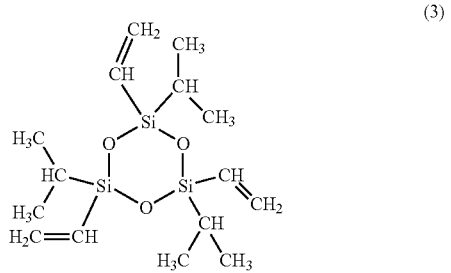

(3)

The dielectric constant of the organic silica film is not particularly limited, but is, for example, 2.7 or less, and can be set to more preferably 2.6 or less. On the other hand, the dielectric constant is 2.0 or more, and can be set to 2.2 or more.

In addition, the C/Si ratio in the organic silica film is, for example, 1 or more, and can be set to more preferably 2 or greater. On the other hand, the ratio is 20 or less, and can be set to 5 or less. In addition, (C/Si) of the organic silica film to the cap insulating film is greater than 1, and is preferably 2 or greater.

It is possible to realize both the improvement in the etching selectivity and the stability of the process by setting this C/Si ratio to be in the above-mentioned range. Particularly, when the organic silica film having a high C content of the C/Si ratio of 2 or greater is used, a CxFy film which is an etching product is easily formed, and the etching rate is easily controlled using the saturated $CF_4/O_2$ ratio. In addition, by increasing the difference of the composition between the cap insulating film mainly containing Si and the organic silica film, the etching selectivity of the organic silica film to the cap insulating film is improved, and the processing selectivity is improved.

Next, a first example of the embodiment will be described.

Figure 3A:
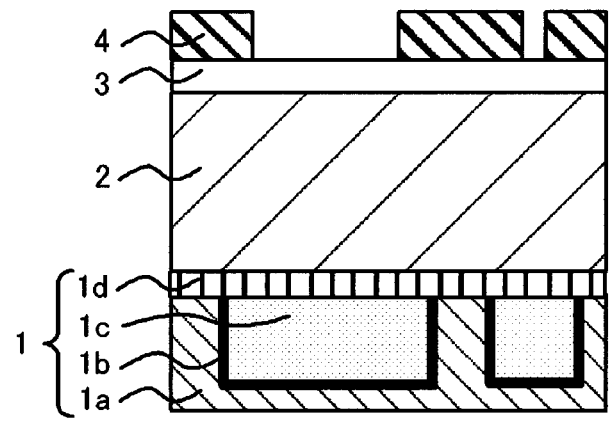
FIGS. 3A to 3C are cross-sectional views illustrating a process of manufacturing a semiconductor device according to an embodiment of the invention.
Figure 3B:
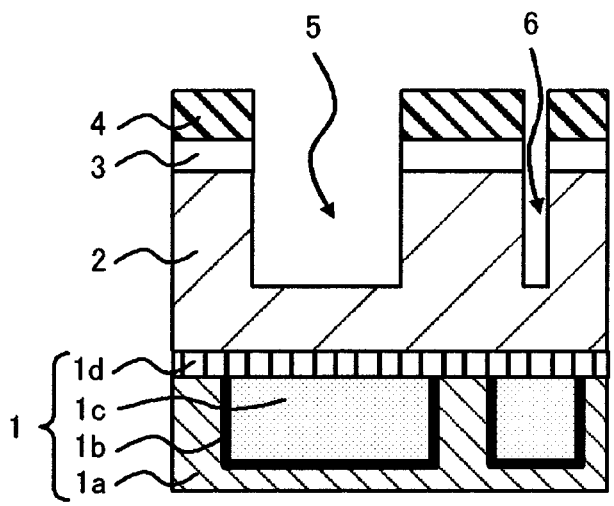
Figure 3C:
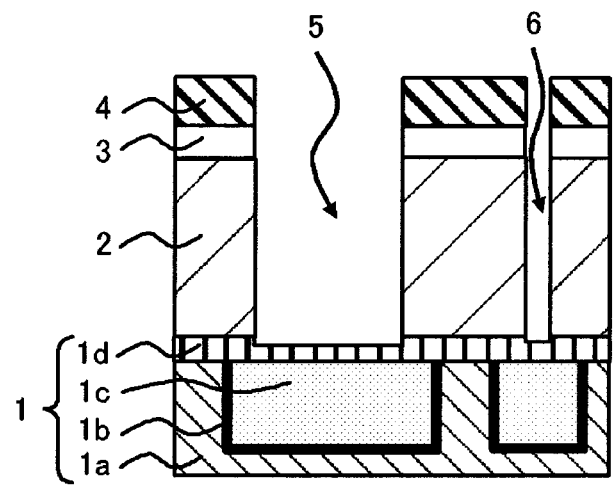
Figure 4:
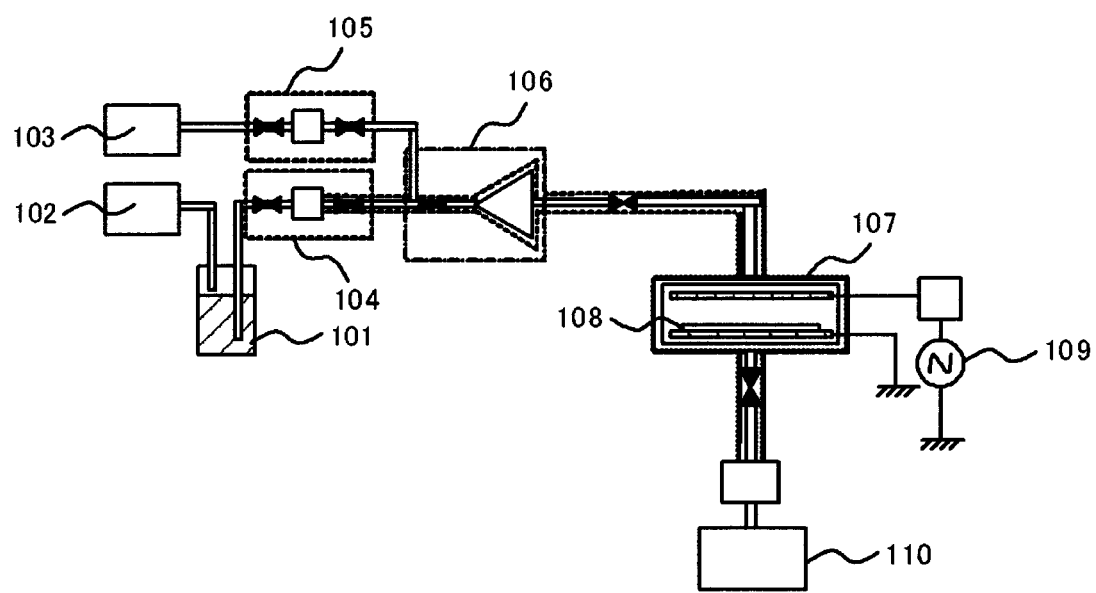
FIG. 4 is a diagram illustrating an outline of a film forming apparatus according to the embodiment of the invention.
Figure 5:
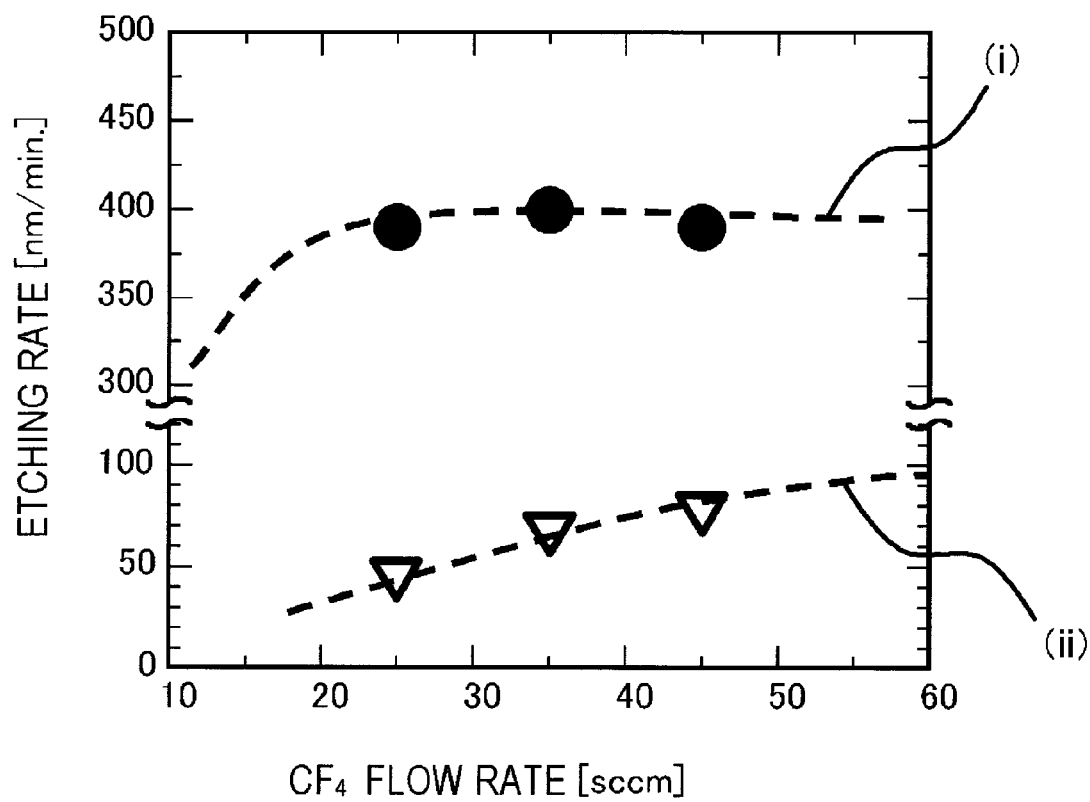
FIG. 5 is a diagram for explaining an effect according to the embodiment of the invention.
Figures 6A, 6B:
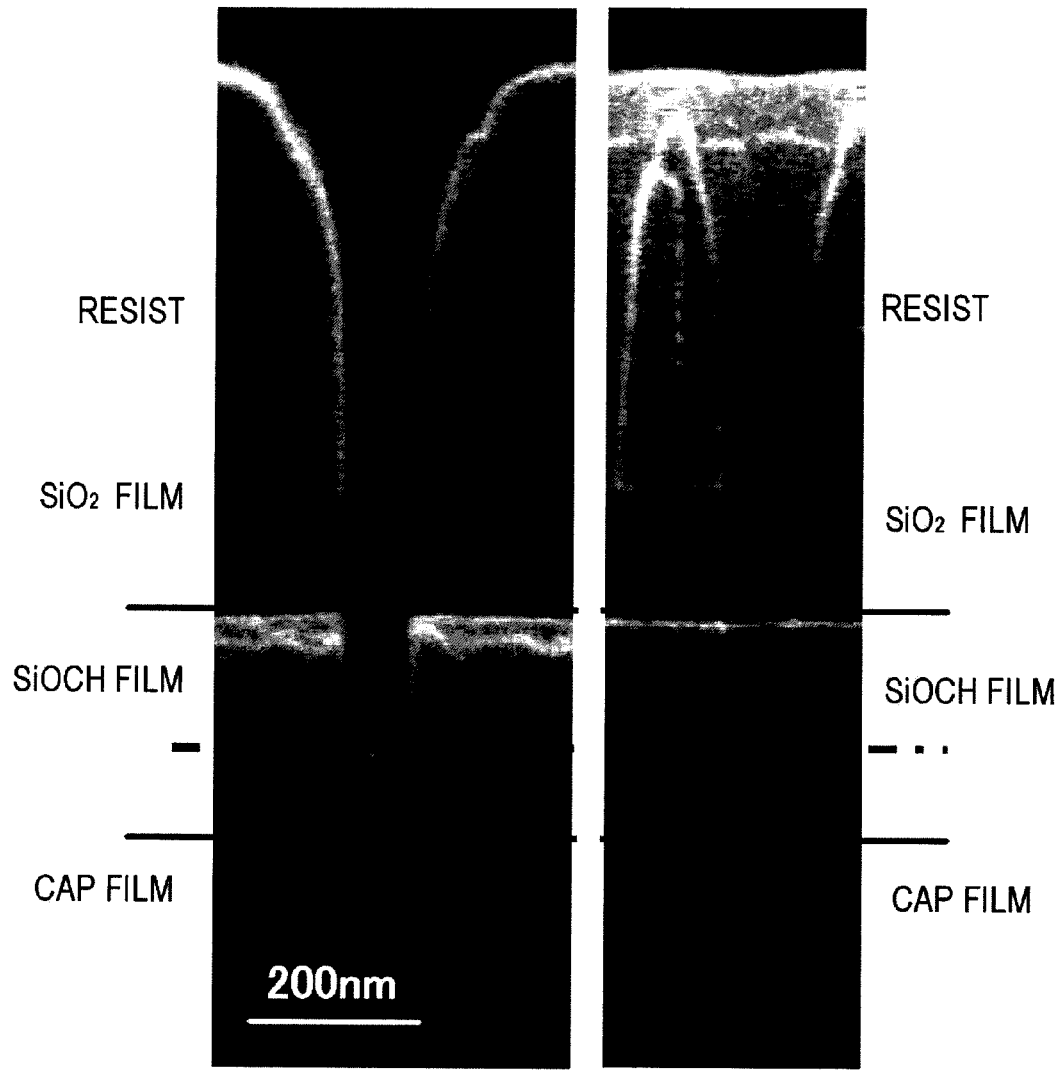
FIGS. 6A and 6B are cross-sectional views illustrating a line and a via according to the embodiment of the invention.

FIGS. 3A to 3C are cross-sectional views illustrating a process of manufacturing the semiconductor device according to the first example of the embodiment. FIG. 4 shows an outline of a film forming apparatus in the embodiment. FIG. 5 is a diagram for explaining an effect according to the embodiment. FIGS. 6A and 6B are cross-sectional views a line and a via according to the embodiment.

As shown in FIG. 3A, an organic silica film 2 for an upper-layer interconnect and a hard mask 3 ($SiO_2$) are sequentially formed over the semiconductor substrate in which a lower-layer interconnect structure 1 is previously formed. Here, the lower-layer interconnect structure 1 is constituted by an organic silica film 1a, a barrier metal film 1b, a Cu film 1c and a cap insulating film 1d.

A plasma polymerization method is used in a method of forming the organic silica film 2. In addition, though a CVD method may be used in forming the hard mask 3, the CVD method may also be used in forming the organic silica film 2. At this time, the hard mask 3 may include a laminated structure in which a organic silica film, having a composition different from that of the organic silica film 2, according to the embodiment is used. A resist mask 4 is formed on the hard mask 3, and line-shaped via 5 and a columnar via 6 having opening diameters different from each other are form by dry etching using the resist mask (FIG. 1B). In the formation of the vias, even when the opening diameters are different from each other, the via hole can be etched down to the cap insulating film 1d at the same etching rate. For this reason, the amounts of overetching to the cap insulating film can be the same without depending on the opening diameter and the opening area. At this time, the remaining film thicknesses of the cap insulating film can be also the same without depending on the opening diameter and the opening area.

Here, a method of forming the organic silica film will be described in detail.

As an example of the organic silica film according to the embodiment, the porous SiOCH film having a composition ratio of Si:O:C=1:0.9:2.7 can be used. The vacancy of this porous SiOCH film is an independent vacancy and the diameter thereof can be set to 0.8 nm or less.

FIG. 4 is a schematic diagram illustrating a film forming apparatus of the organic silica film. The film forming apparatus according to the embodiment includes a reservoir 101, a raw material pressurizing and feeding portion 102, a carrier gas supply portion 103, a liquid mass flow controller 104, a gas mass flow controller 105, a vaporizer 106, a reactor 107, a RF power supply 109, and an air exhaust pump 110.

Hereinafter, each of the components of the film forming apparatus will be described.

The reservoir 101 is a container that keeps and stores a monomer raw material. The raw material pressurizing and feeding portion 102 supplies gas for pressurizing and feeding a raw material within the reservoir 101. He is used as the pressurizing and feeding gas. The carrier gas supply portion 103 supplies He for transporting the monomer raw material. The liquid mass flow controller 104 controls the flow rate of the raw material to be supplied. The gas mass flow controller 105 controls the flow rate of He which is carrier gas. The vaporizer 106 vaporizes the monomer raw material. The vaporization temperature is preferably determined from the boiling point or the vapor pressure of the raw material and the polymerization initiation temperature, and is generally 50° C. to 200° C., properly 75° C. to 150° C. When the vaporization temperature is a low temperature of 50° C. or higher, it is possible to suppress a cause of a case where the vaporization becomes unstable. On the other hand, when the vaporization temperature is a high temperature of 200° C. or lower, it is possible to suppress a cause of a case where a portion of raw material molecules is thermally decomposed or thermally polymerized before vaporization. The reactor 107 is a film forming chamber in which film formation is performed on the gasified raw material by plasma polymerization.

The RF power supply 109 supplies high-frequency power. Thereby, the gasified monomer raw material or carrier gas is plasmarized. The organic silica film is grown on a substrate 108 placed within the reactor 107 by chemical vapor deposition. The air exhaust pump 110 exhausts the raw material gas and the carrier gas introduced into the reactor 107. In addition, excited gas or oxidized gas can be introduced into the reactor 107 in a system (not shown) different from the raw material. Inert gas such as helium (He), argon (Ar), neon (Ne), and xenon (Xe) is generally used as the excited gas. It is preferable to select the same gas as the carrier gas. In addition, oxygen ($O_2$), carbon dioxide ($CO_2$), carbon monoxide (CO), nitrogen monoxide ($N_2O$), nitrogen dioxide ($NO_2$) and the like can be used as the oxidized gas.

Subsequently, a process of forming the organic silica film will be described using the film forming apparatus according to the embodiment. Here, the film formation is performed using the raw material having a cyclic organic silica structure shown in the above-mentioned General Formula (1).

First, the raw material is sent out from the reservoir 101 by the He gas supplied by the raw material pressurizing and feeding portion 102. The flow rate of the raw material is controlled by the liquid mass flow controller 104. On the other hand, the He gas is supplied from the carrier gas supply portion 103. The flow rate of the He gas is controlled by the gas mass flow controller 105. The raw material and the He gas which is carrier gas are mixed just before the vaporizer 106, and are introduced into the vaporizer 106. A heated heater block (not shown) is disposed within the vaporizer 106. The liquid monomer raw material is vaporized within the vaporizer 106, and a vaporized product is introduced into the reactor 107 together with the carrier gas. The vaporized monomer raw material and carrier gas are plasmarized within the reactor 107, for example, through a high frequency of 13.56 MHz, and the organic silica film is grown on the substrate 108.

The flow rate of the monomer raw material introduced into the reactor 107 is preferably equal to or more than 0.1 g/min and equal to or less than 10 g/min, more preferably equal to or less than 2 g/min. The flow rate of He which is carrier gas is preferably equal to or more than 50 sccm and equal to or less than 5,000 sccm, more preferably equal to or less than 2,000 sccm. The pressure within the reactor 107 is preferably 133 to 1,333 Pa. the power of the RF power supply 109 is preferably equal to or less than 2,000 W with respect to a 300 mm wafer, more preferably equal to or less than 1,000 W.

FIG. 5 shows an etching rate in the case where the vias having different opening diameters shown in the first example is dry-etched at the same rate. In FIG. 5, (i) denotes the organic silica film, and (ii) denotes the cap insulating film. It is known that the etching rate of the high carbon-containing organic silica film is constant at the portion in which $CF_4$ is 20 to 50sccm. That is, even when the amount of $CF_4$ supply from plasma is different by two times or more by the pattern, the processing rate is the same. The etching conditions other than the flow rate of $CF_4$ in this case are, for example, Ar: 600 sccm, $N_2$: 200 sccm, $O_2$: 10 sccm, pressure: 30 mTorr, and RF power: 500 to 1,200 W. In this case, the $N_2$/Ar ratio is 3.0, and the saturated $CF_4/O_2$ ratio is 1.5 or greater. When the $CF_4/O_2$ ratio is 5.0 or less, the selectivity becomes high. Even when an amine-based gas such as ammonia gas or methylamine, dimethylamine, and trimethylamine is used in place of $N_2$, the same effect as $N_2$ is obtained.

FIGS. 6A and 6B show cross-sections in the case where the vias having different opening diameters shown in the first example are simultaneously dry-etched. FIG. 6A shows a line-shaped via 6, and FIG. 6B shows a columnar via 5. When dry etching is actually performed in the conditions in which the $CF_4/O_2$ ratio is 2.5, it is known that the depths of the vias are the same even in the slit (line) pattern and the via pattern having different opening diameters. That is, it is known that the etching rates are the same between the slits having different opening diameters.

Thereafter, overetching is performed using the height of the selectivity of the organic silica film to the cap insulating film (FIG. 3C). In this case, the etching conditions are preferably set to, for example, Ar: 100 to 400 sccm, $N_2$: 400 to 800 sccm, $CF_4$: 15 to 100 sccm, $O_2$: 3 to 20 sccm, pressure: 15 to 30 mTorr, RF power: 500 to 1,500 W, and time: 10 to 60 seconds.

In this case, the inert gas may be rare gas such as He in place of Ar.

The reaction accelerating gas may be ammonia gas or an amine-based gas such as methylamine, dimethylamine and trimethylamine in place of $N_2$, may be quaternary ammonium such as ammonium carbonate, or may be combined gas thereof.

In addition, the fluorocarbon gas may be $CHF_3$, $CH_2F_2$, $CHF_3$, $C_2F_6$, $C_2H_2F_4$, $C_2H_4F_2$, $C_2F_4$, $C_2H_2F_2$, $C_3F_8$, $C_3H_2F_6$, $C_3H_4F_4$, $C_3H_6F_2$, $C_3F_6$, $C_3HF_5$, $C_3H_3F_3$, $C_3H_4F_2$ or $C_3H_5F$ and the like, in place of $CF_4$, or may be combined gas thereof. In addition, the oxidant gas may be any of gas of $CO_2$, $CH_3OH$, $C_2H_5OH$, $C_3H_7OH$, $N_2O$, NO, $N_2O_3$, $NO_2$, $N_2O_4$ or $N_2O_5$, in place of $O_2$, or may be combined gas thereof.

After the via etching, dual damascene etching, chemical processing, a metallization process, and CMP processing are performed, and then the interconnect structure having the via interconnects with different opening diameters is formed. In this case, the remaining film thicknesses of the cap insulating film after the via processing can be the same without depending on the opening diameter and the opening area. For this reason, the cap insulating films under the via at the time of the dual damascene etching can be also opened simultaneously without depending on the opening diameter and the opening area. In the dual damascene etching, the etching conditions set to, for example, Ar: 100 to 400 sccm, $CF_4$: 50 to 400 sccm, $O_2$: 3 to 20 sccm, pressure: 15 to 50 mTorr, RF power: 200 to 1,000 W, and time: 10 to 60 seconds are preferably used.

Figure 13:
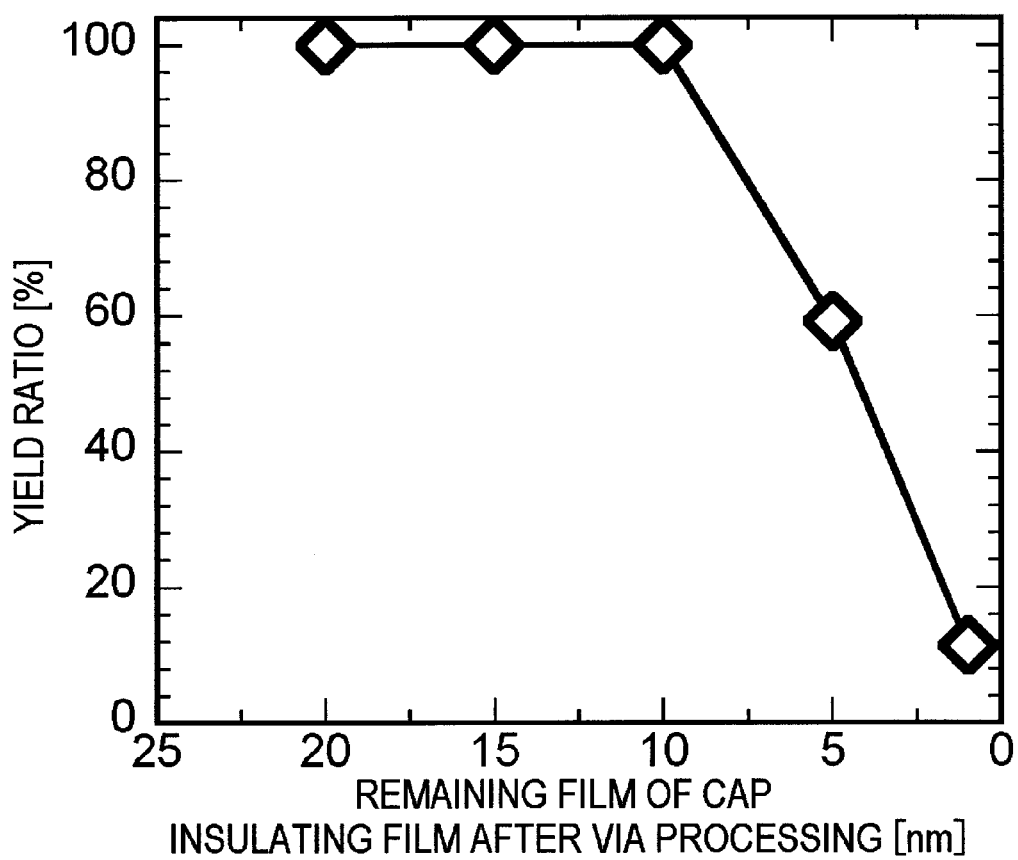
FIG. 13 is a diagram illustrating the relationship between the remaining film of a cap insulating film and the yield ratio.
Figure 14:
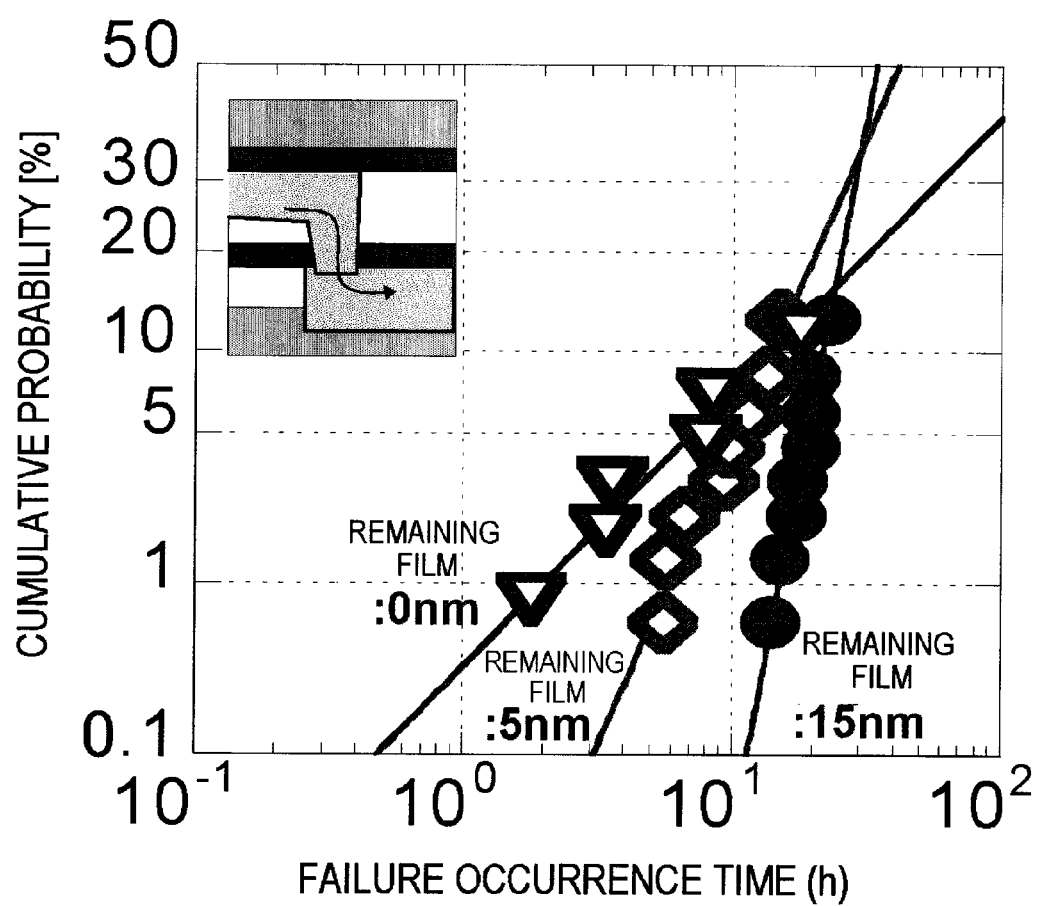
FIG. 14 is a diagram illustrating the relationship between the remaining film of the cap insulating film and reliability.

In addition, Cu (Cu film 1c) is protected by the remaining film of the cap insulating film 1d after the via processing, whereby Cu (Cu film 1c) of the opening portion of the cap insulating film 1d can be managed with a good controllability. For example, asking processing in which $O_2$ or $CO_2$ is used in resist stripping after the via processing is performed, and carbon is contained in the cap insulating film 1d. Therefore, since $O_2$ is used in the dual damascene etching, Cu (Cu film 1c) of the opening portion of the cap insulating film 1d is easily oxidized. FIG. 13 shows the relationship between the cap insulating film 1d and the via yield ratio after the via processing in a via-first dual damascene process. As shown in FIG. 13, it is known that the via yield ratio is deteriorated in a region in which the remaining film of the cap insulating film after the via processing is less than 10 nm. In addition, as shown in FIG. 14, dependence of the remaining film of the cap insulating film is seen even in an Electron Migration (EM) reliability test. As shown in FIG. 14, it is known that as the remaining film grows thinner like thicknesses of 15 nm (circle), 5 nm (rhomboid), and 0 nm (triangle), the EM lifetime is deteriorated. In this manner, the lack of the remaining film of the cap insulating film after the via processing has a great influence on the via reliability. However, in the first example, since variation in the depth of the via can be easily reduced as mentioned above, the remaining film of 10 nm or more is easily secured without depending on the opening diameter and the opening area of the via. For this reason, in the first example, the remaining films of the cap insulating film 1d after the via processing are the same, and Cu (Cu film 1c) can be protected from oxidation and the like. In addition, since the remaining films are the same, and the caps are also opened simultaneously at the time of the dual damascene etching, the amount of overetching to the Cu interconnect after being opened, for example, the amount of overetching of 15 nm (100%=20 seconds) with respect to the remaining film thickness of the cap insulating film of 15 nm can be the same in all the vias without depending on the opening diameter and the opening area. That is, since the time taken to be exposed to plasma in the surface of the Cu interconnect (Cu film 1c) under all the vias is equal to 20 seconds, oxidation of the surface of the Cu film 1c due to the influence of overetching, or further the etching product to be attached, and the degree of the Cu deformation amount and the like can not also depend on the opening diameter and the opening area, and theses variations are suppressed. For this reason, the cleaning effect by chemical processing can be also the same between all the vias (via 5 or via 6 and the like).

As stated above, after Cu is buried in the via portion, the interface composition between the via and the lower-layer Cu interconnect and the shape thereof can become homogeneous in the in-plane of the wafer. Here, the interface composition indicates, for example, the content of oxygen near the surface of Cu (Cu film 1c), and the like. In the first example, even when the composition analysis of the interface between the via and the Cu interconnect of the via hole (via 5) and the slit-shaped via pattern (via 6) is performed, the detected states can be the same.

On the contrary, in the case of the lack of the stop property in the cap insulating film, for example, when the cap insulating film is removed during the via hole, there may be a case where the Cu surface under the via hole is oxidized (FIG. 15A). As a result, as shown in FIG. 15B, CuO (peak equivalent to CuO: 930 to 940 (eV)) is detected only in the portion under the via hole by the TEM-EELS. In the A point, since the peak equivalent to this CuO protrudes with respect to the peak equivalent to Cu, it is known that CuO exists. On the other hand, in the B point (reference), since the peak equivalent to CuO which protrudes with respect to the peak equivalent to Cu does not exist, it is known that CuO does not exist.

On the other hand, in the first example, the remaining film of the cap insulating film after the via processing can be controlled. In the first example, the remaining film of the cap insulating film id after the via processing is in the same level, and thus Cu (Cu film 1c) can be protected from oxidation and the like. For this reason, in the first example, the entire surface of the Cu interconnect between the vias having different opening diameters can be configured such that the peak equivalent to CuO which protrudes with respect to the peak equivalent to Cu measured by the TEM-EELS does not exist. That is, the entire surface of the Cu interconnect between the via having different opening diameters can be configured such that oxidation is prevented, and that CuO does not substantially exist. For this reason, the composition of the interface between the via and the Cu interconnect or the shape thereof can be homogeneously controlled in the in-plane of the wafer, and variation in the via resistance can be reduced, thereby allowing the reliability to be improved.

Here, description of the effect of the first example will be put together.

In the embodiment, it is possible to improve the etching selectivity through the N-containing gas by setting (C/Si) of the organic silica film to the cap insulating film to 1 or greater. It is possible to suppress variation in the depth between the vias having different opening diameters by improving the etching selectivity.

Further, in the embodiment, it is possible to improve the etching selectivity through the fluorocarbon gas by setting (C/Si) of the organic silica film to 1 or greater. Particularly, when etching is performed at the saturated $CF_4/O_2$ ratio, the etching rate can become constant without depending on the opening diameter (or opening area) between the vias, thereby allowing the depths of the vias to be made equal between the vias having different opening diameters. That is, mixed gas having a $N_2/Ar$ ratio of 1 or greater and a $CF_4/O_2$ ratio of 5 or less is used, whereby it is possible to realize the etching stop property of the cap insulating film while the difference between patterns of the slit-shaped via patterns having different opening diameters is reduced. In this case, mixed gas including the inert gas, the reaction accelerating gas, the fluorocarbon gas, and the oxidant gas is used, whereby it is possible to collectively form a plurality of via holes having different opening areas.

Generally, highly ionic etching by the high Ar flow rate is effective in suppressing the difference between patterns. The highly ionic etching is to draw an etchant into the etching surface by application of a bias voltage. However, in etching of the porous organic silica film having a low carbon concentration, there is a concern that since the effect of improvement in the etching rate by the ion bombardment becomes excessively large, the sub-trench shape is formed in the highly ionic etching including a large amount of Ar ions.

On the other hand, in the embodiment, it is possible to suppress damage of the process by using the carbon-rich organic silica film (for example, having (C/Si) of 2 or greater). The above-mentioned concern can be avoided even while the highly ionic etching by the high Ar flow rate is used.

When etching is performed using $O_2$ in the low carbon porous organic silica film ((C/Si)<1), there may be a case where carbon in the film is pulled out during etching, and the portion such as the via sidewall becomes a film close to $SiO_2$, which results in a rise in the dielectric constant. Particularly, since the area of the via sidewall is large in the slit-shaped via pattern compared to the normal via pattern, there may be a case where the influence of an increase in the dielectric constant becomes large, to thereby decrease the device performance.

On the other hand, in the embodiment, it is possible to avoid such a negative effect by using the carbon-rich organic silica film (for example, having (C/Si) of 1 or greater).

Moreover, as mentioned above, in the embodiment, the etching selectivity of the insulating interlayer to the cap insulating film is sufficiently obtained. For this reason, it is not required to improve the etching stop property by thickening the cap insulating film. Thereby, it possible to raise the effective dielectric constant, and to realize high performance and low power consumption of an LSI.

Next, a second example of the embodiment will be described.

Figure 10:
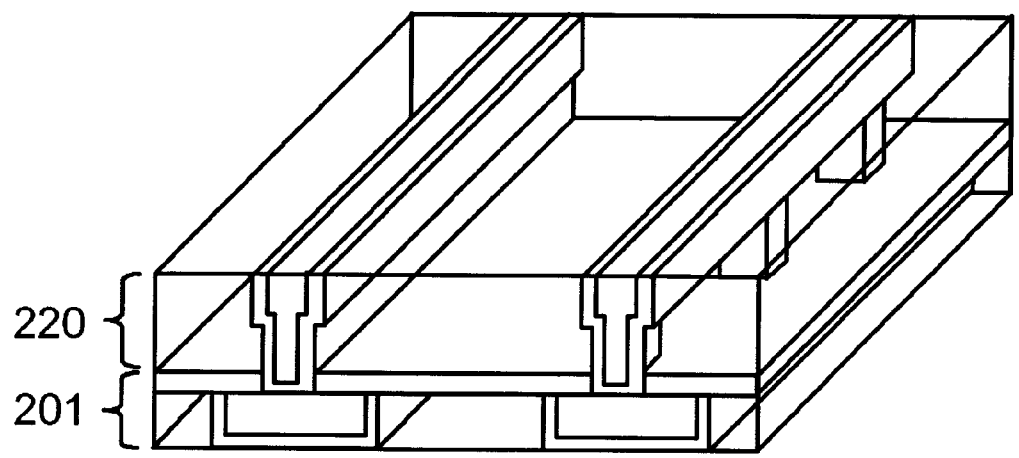
FIG. 10 is a birds-eye view illustrating the semiconductor device according to the embodiment of the invention.

FIGS. 7A and 7C to FIGS. 9A and 9C are cross-sectional views illustrating a process of manufacturing the semiconductor device according to a second example of the embodiment. FIG. 10 is a birds-eye view illustrating the semiconductor device according to the second example of the embodiment.

Figure 7A:
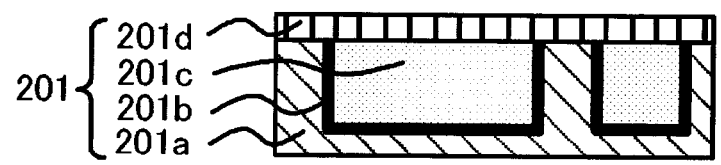
FIGS. 7A to 7C are cross-sectional views illustrating the process of manufacturing the semiconductor device according to the embodiment of the invention.

First, as shown in FIG. 7A, the lower-layer interconnect structure 201 is formed over the silicon substrate (not shown) by a single damascene method. This lower-layer interconnect structure 201 is constituted by the organic silica film 201a, the barrier metal film 201b, the Cu film 201c, and the cap insulating film 201d.

Figure 7B:
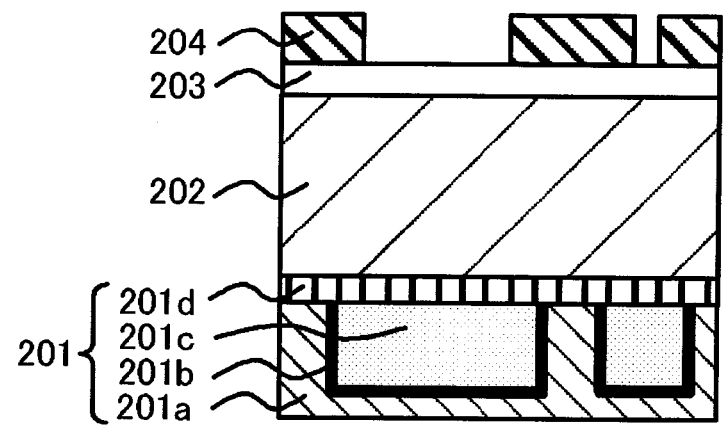

Subsequently, as shown in FIG. 7B, the organic silica film 202 is formed on the lower-layer interconnect structure 201. This organic silica film 202 is formed by a plasma polymerization method using the compound having a cyclic organic silica structure shown in the above-mentioned Formula 3. The organic silica film 202 has, for example, a thickness of 230 nm and a specific dielectric constant of 2.5. The organic silica film 202 is, for example, a porous organic silica film having vacancies in the film with a composition ratio of Si:O:C=1: 0.9:2.7 in which the vacancy is an independent vacancy and the diameter of the vacancy is 0.8 nm or less. Thereafter, for example, He plasma processing for the processing time of 15 to 30 seconds is performed, and a hard mask 203 is formed in the same chamber by a plasma CVD method in which $SiH_4$ is used as a source gas. This hard mask 203 is formed as a $SiO_2$ film having a thickness of 80 nm, for example. As the $SiO_2$ film of the hard mask 203, a $SiO_2$ film in which TEOS (tetraethoxysilane) is used as a source gas may be used. In addition, this may be performed in the chamber separate from the formation of a surface modification layer through the He plasma processing and the film formation of the hard mask 203. Thereafter, slit-shaped via patterns are formed in a resist 204 by lithography. In this case, a slit-shaped via pattern having the smallest opening diameter is formed as a via hole.

Figure 7C:
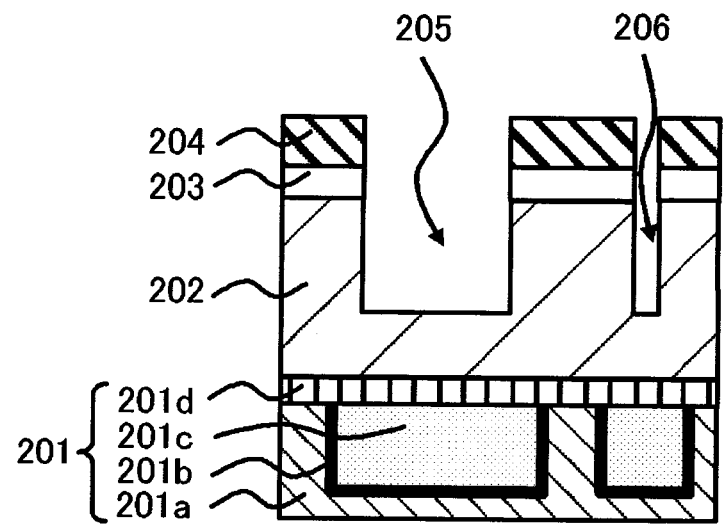
Figure 8A:
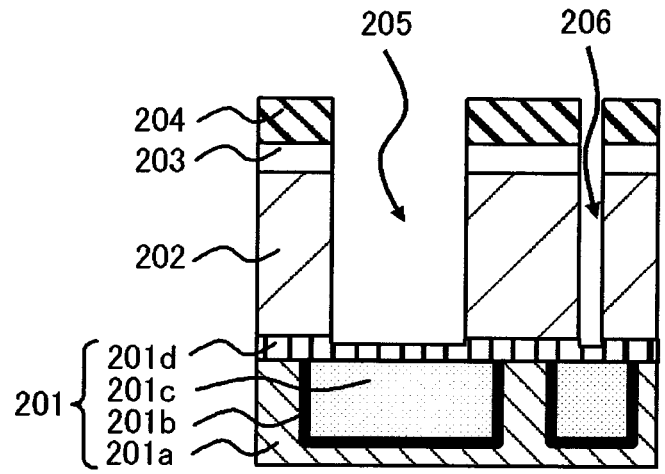
FIGS. 8A to 8C are cross-sectional views illustrating the process of manufacturing the semiconductor device according to the embodiment of the invention.

Subsequently, as shown in FIG. 7C, a plurality of concave portions (via 205 and via 206) having different opening diameters is formed in the conditions of high uniformity/highly-selective etching. That is, the slit-shaped via 205 having a large opening diameter and the via 206 having a small opening diameter are simultaneously formed by dry etching. Etching is performed until the bottoms of each of the vias reach the cap insulating film 201d (FIG. 8A). The via 205 and the via 206 may be formed as an independent sparse pattern, but may be respectively formed as a dense via pattern group which is dense with a plurality of vias. In this case, the etching conditions are preferably set to, for example, Ar: 100 to 400 sccm, $N_2$: 400 to 800 sccm, $CF_4$: 15 to 100 sccm, $O_2$: 3 to 20 sccm, pressure: 15 to 30 mTorr, RF power: 500 to 1,500 W, and time: 10 to 60 seconds. In addition, as materials of the cap insulating film 201d, the above-mentioned materials are used, and the C/Si ratio is preferably 1.0 to 1.5.

At the time of the formation of the via 205 and the via 206, they may be formed by the same method as that of the via 5 and the via 6 shown in the first example.

Figure 8B:
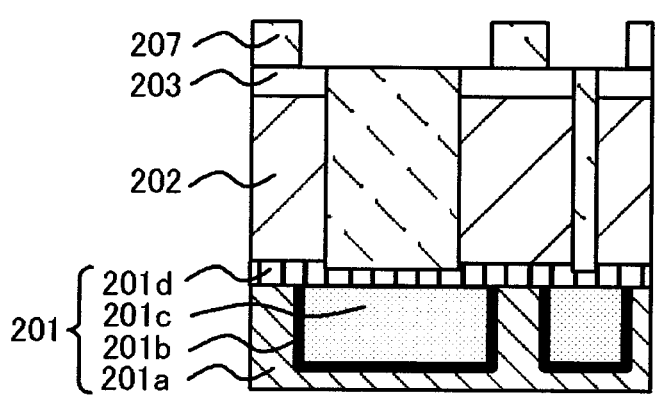
Figure 8C:
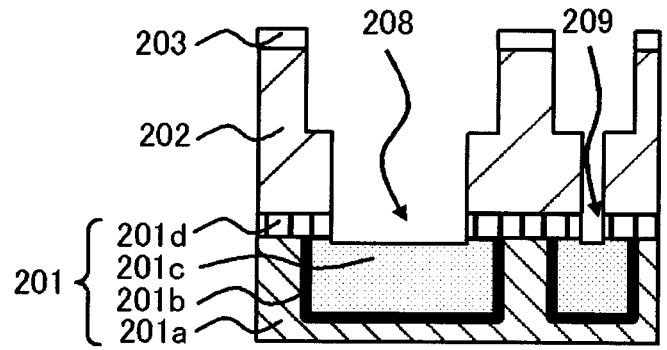

Subsequently, interconnect trenches (opening 208 and opening 209) are formed in the organic silica film 202 by lithography and dry etching, using a resist 207 (FIGS. 8B and 8C). When these interconnect trenches are formed, simultaneously, the cap insulating film 201d is opened, and the Cu interconnect 201c of the lower-layer interconnect structure 201 is exposed. As the conditions of dry etching of the interconnect trench, the etching conditions set to, for example, Ar: 100 to 400 sccm, $CF_4$: 50 to 400 sccm, $O_2$: 3 to 20 sccm, pressure: 15 to 50 mTorr, RF power: 200 to 1,000 W, and time: 10 to 60 seconds are preferably used. Since the remaining films of the cap insulating film 201d can be the same without depending on the opening diameter of the via, the opening 208 having a large opening diameter and the opening 209 having a small opening diameter of the cap insulating film 201d are simultaneously opened. In this case, the opening 208 and the opening 209 may be an independent sparse via pattern, and may be a dense via pattern group.

Next, Cu oxides or etching products of the Cu interconnect surface of the opening 208 and the opening 209 are cleaned by chemical processing. In this case, the chemical preferably contains fluorine. This is because the chemical containing fluorine is highly effective in removal of the Cu oxide or removal of the etching product. As mentioned above, the cap insulating film 201d is simultaneously opened without depending on the opening diameter and the opening area, and thus in all Cu interconnect surfaces, the time taken to be exposed to plasma can be the same. For this reason, oxidation of the Cu surface due to the influence of overetching or the etching product to be attached, and the degree of the Cu deformation amount and the like can be also the same without depending on the opening diameter and the opening area. For this reason, the cleaning effect through the chemical processing can be the same in all the vias, and the interface composition between the via and the lower-layer Cu interconnect and the shape can become homogeneous in the in-plane of the wafer. When the surface composition or the surface shape of the Cu interconnect in the opening can be homogeneously controlled within the surface of the wafer, variation in the via resistance can be reduced.

As shown in FIG. 9A, after the chemical processing, the barrier metal film 210 made of a TaN film and a Ta film, and the Cu thin film are formed on the entire surface of the substrate by an ionization sputtering method. The Cu film 211 made of Cu or a Cu alloy and the like is formed by an electrolytic plating method using this Cu thin film as an electrode.

Thereafter, as shown in FIG. 9B, after heat treatment is performed in the nitrogen atmosphere at a temperature of for example 350° C. for two minutes in order to grow Cu grains, redundant Cu is removed by the CMP. Redundant Ta, TaN, and the hard mask 203 are removed by the CMP through a change of the slurry and the polishing head. The surface of the organic silica film 202 is exposed, and the CMP is completed. Thereafter, as shown in FIG. 9C, a SiCN film is formed on the entire surfaces of the Cu film 211 and the organic silica film 202 as the cap insulating film 212.

In this manner, the semiconductor device of the embodiment as shown in FIG. 10 is obtained.

In a method of the related art, there is a via forming process in which the selectivity of the organic silica/cap insulating films is low, and the difference between patterns is large. As a result, there has been a case where after a two-layer interconnect is formed, the composition of the interface between the via and the lower-layer Cu interconnect depends on the opening diameter and the opening area of the via, and as the opening diameter increases, the amount of detected impurities in the Cu interconnect such as oxygen increases.

On the other hand, in the example, the composition of the interface between the via and the lower-layer Cu interconnect and the shape thereof can become homogeneous in the in-plane of the wafer. For this reason, the amounts of detected impurities in the Cu interconnect can be the same without depending on the opening diameter and the opening area. The composition of the interface between the via and the lower-layer Cu interconnect can be detected by a physical analysis method such as the TEM-EELS.

In the embodiment, it is preferable that the organic silica film has an atom composition ratio of C/Si of 2 or greater and a high C content. The film having a high C content causes a CxFy film which is an etching product to be easily formed. Thereby, the etching rate is easily controlled using the saturated $CF_4/O_2$ ratio. In addition, the difference of the composition between the cap insulating film mainly containing Si and the organic silica film increases, and thus the etching selectivity of the organic silica film to the cap insulating film is improved. For this reason, the processing selectivity is improved.

The same effect as that of the first example is also obtained in the second example.

Next, a third example of the embodiment will be described.

Figure 11:
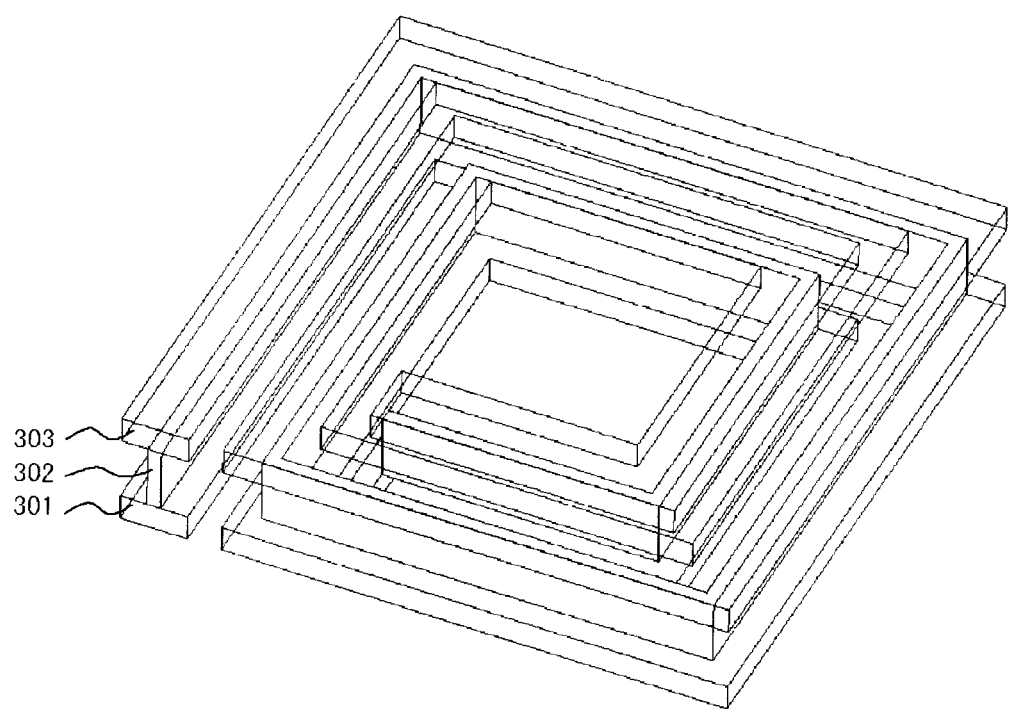
FIG. 11 is a birds-eye view illustrating the semiconductor device according to the embodiment of the invention.

FIG. 11 is a birds-eye view illustrating the semiconductor device according to a third example of the embodiment.

In the semiconductor device according to the third example, signal processing such as analog/RF is performed. In this case, the Cu interconnect can be formed as an inductor in a vortex shape.

The semiconductor device according to the example includes a lower-layer Cu interconnect 301 formed over a substrate (not shown) by a damascene method, a cap insulating film (not shown), containing silicon carbide as a main ingredient, formed on the Cu interconnect, an organic silica film having at least (C/Si) larger than that of the cap insulating film thereon, and an upper-layer Cu interconnect 303 formed on the organic silica film. The upper-layer Cu interconnect 303 is connected to the lower-layer Cu interconnect 301 through a slit-shaped via 302. Upper and lower interconnects are connected to each other through the slit-shaped via having a low resistance. Thereby, the two-layer Cu interconnect can be used as one inductor. Therefore, according to the third example, it is possible to sufficiently fulfill a circuit function as an inductor element.

A laminated structure (not shown) of an organic silica film and a hard mask formed on the lower-layer Cu interconnect 301 is formed, and a slit-shaped via pattern is formed in a resist by the same method as that of the second example. Subsequently, the slit-shaped via 302 having a large opening diameter and a via (not shown) having a small opening diameter, which are different from each other in opening diameter, are simultaneously formed by dry etching in the highly uniform/highly-selective etching conditions, and processing is performed down to the cap insulating film. Since the via hole can be etched down to the cap insulating film at the same etching rate even in the case of different opening diameters, the amounts of overetching to the cap insulating film can be the same without depending on the opening diameter and the opening area. In this case, the remaining film thicknesses of the cap insulating film can be also the same without depending on the opening diameter and the opening area. In this case, in the formation of the slit-shaped via 302, the etching conditions set to, for example, Ar: 100 to 400 sccm, $N_2$: 400 to 800 sccm, $CF_4$: 15 to 100 sccm, $O_2$: 3 to 20 sccm, pressure: 15 to 30 mTorr, RF power: 500 to 1,500 W, and time: 10 to 60 seconds are preferably used. At the time of forming the slit-shaped via 302, the slit-shaped via can be formed by the same method as that of the via formation of the first example.

The slit-shaped via 302 that connects the upper and lower interconnects to each other may be a plurality of vias having different opening diameters and shapes. In addition, the Cu interconnect layer used as an inductor may be three layers or four layers.

In the third example, when an inductor is formed in the fine Cu interconnect, it is possible to lower the interconnect resistance while thickening the width of the interconnect. Thereby, the inductor is caused to emit heat and power loss becomes large, and thus it is possible to suppress occurrence of a decrease in the function of the device.

The same effect as that of the first example is also obtained in the third example.

Next, a fourth example of the embodiment will be described.

Figure 12:
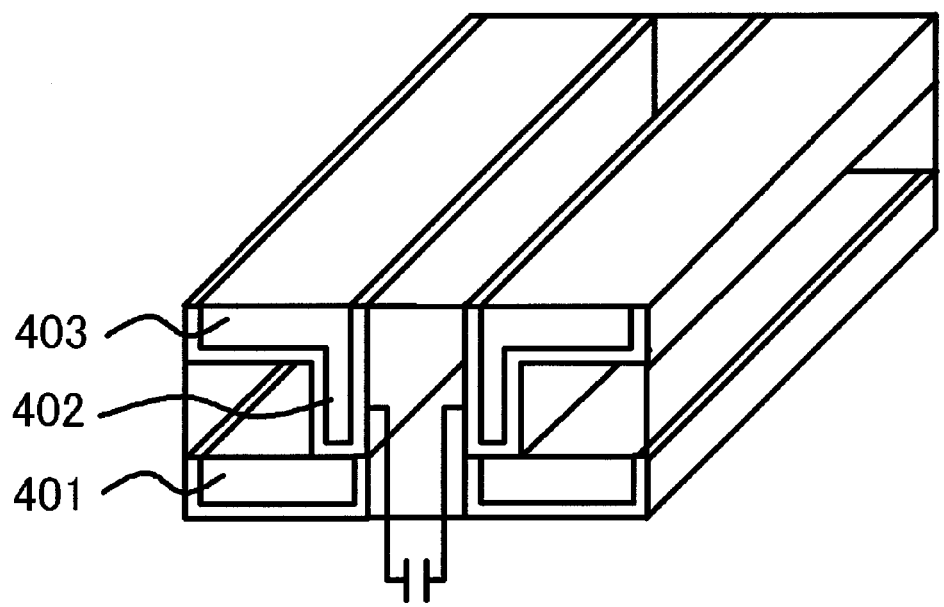
FIG. 12 is a birds-eye view illustrating the semiconductor device according to the embodiment of the invention.

FIG. 12 is a birds-eye view illustrating the semiconductor device according to a fourth example of the embodiment.

The semiconductor device according to the fourth example is configured such that in an A/D converter which converts an analog signal to a digital signal, the capacitance between interconnects of local interconnects is used as the capacitance of a capacitive element of a parallel plate.

The semiconductor device of the example includes a lower-layer Cu interconnect 401 formed over a substrate (not shown) by a damascene method, a cap insulating film (not shown), containing silicon carbide as a main ingredient, formed on the Cu interconnect, an organic silica film having at least (C/Si) larger than (C/Si) of the cap insulating film thereon, and an upper-layer Cu interconnect 403 formed on the organic silica film. The upper-layer Cu interconnect 403 is connected to the lower-layer Cu interconnect 401 through a slit-shaped via 402. Upper and lower interconnects are connected to each other through the slit-shaped via 402 having a low resistance. Thereby, the local interconnect can function as the capacitive element in the Cu interconnect.

At the time of forming the slit-shaped via 402, the slit-shaped via is formed by the same method as that of the slit-shaped via 302 shown in the third example. The slit-shaped via 402 having a large opening diameter and a via (not shown) having a small opening diameter, which are different from each other in opening diameter, are simultaneously formed by dry etching. The processing conditions of the slit-shaped via 402 are also the same as those of the first example. The remaining film thicknesses of the cap insulating film after the via processing are the same, as mentioned above, without depending on the opening diameter and the opening area. For this reason, the cap insulating films under the via at the time of the dual damascene etching can be also opened simultaneously without depending on the opening diameter and the opening area. Therefore, in the surfaces of the Cu interconnect under all the vias after opened, the time taken to be exposed to plasma can be the same. For this reason, oxidation of the Cu surface due to the influence of overetching or the etching product to be attached, and the degree of the Cu deformation amount and the like can be also the same without depending on the opening diameter and the opening area. For this reason, the cleaning effect through the chemical processing can be also the same in all the vias, and thus even after Cu is buried in the via, the interface composition between the via and the lower-layer Cu interconnect and the shape thereof can become homogeneous in the in-plane of the wafer.

The slit-shaped via 402 is set up so as to be located at the endmost distance between the adjacent interconnects, whereby it is possible to increase the parasitic capacitance between the interconnects, and to suppress variation as the capacitive element.

However, the upper-layer Cu interconnect 403 is not limited to the structure shown in FIG. 12, but may have a width of the interconnect larger than that of the slit-shaped via 402, and may have a width of the interconnect equal to that. In addition, the slit-shaped via 402 may be a plurality of vias having different opening diameters or shapes.

Meanwhile, the embodiment and a plurality of modified examples mentioned above can be of course combined in the scope in which the contents thereof are contrary to each other. In addition, in the embodiment and the modified examples mentioned above, although the structure of each part and the like are specifically described, the structure thereof and the like can be variously changed in the scope that satisfies the invention.

In the embodiment, the via hole having an aspect ratio of less than 2 and the via hole having an aspect ratio of 2 or greater may be combined.

In the embodiment, a slit-type via structure and a cylindrical through-hole via can be combined. The contact area is increased by using the slit-type via structure, thereby allowing the resistance to be reduced. For this reason, in the embodiment, it is possible to avoid a decrease in the operation speed of a high-speed analog/on-chip inductor and the like or deterioration of the characteristics thereof.

In the embodiment, processing can be performed so that there is no difference between patterns of the slit-shaped via patterns having different opening diameters. Therefore, in the interface of the organic silica film and the cap insulating film, even the trench-first process in which adjustment of the processing depth of the via through overetching is not performed can be used in the via etching process of the embodiment. In the embodiment, since the process having a high etching selectivity can be realized, the process margin of the via processing can be taken to a large extent. Further, the cap insulating film can be used in the hard mask at the time of the via processing, using the selectivity. For this reason, in the embodiment, it is also possible to perform processing with a better controllability than that in the trench-first process of the related art in which a metal hard mask difficult to deal with is used.

Further, in the embodiment, since the etching selectivity can be improved, the via-first dual damascene processing method can be applied.

Here, in the so-called via-first dual damascene processing method in which the through-hole via is formed in advanced of the trench interconnect, etching is stopped on the cap insulating film formed on the copper interconnect, and overetching is performed, whereby the difference between patterns of the etching rate or the in-plane variation and the like are absorbed. Further, the lower-layer Cu interconnect is protected by this cap insulating film, whereby a decrease in the connection yield ratio or deterioration of the reliability due to surface alteration such as oxidation of the lower-layer Cu interconnect layer in the next process for forming the trench interconnect in the interconnect insulating interlayer is prevent. For this reason, in the via-first dual damascene processing method, variation in the processing depth of the via is small, and opening is easily controlled under the via. Therefore, the method is a process having a higher processing controllability than that in the trench-first dual damascene processing method in which the via processing is stopped on the way.

Hereinafter, a supplementary description will be made of terms used in the present specification.

The term "insulating film" indicates a film (insulating interlayer) for insulating and isolating, for example, interconnect materials, and the term "low-dielectric constant insulating film" indicates a material having a lower specific dielectric constant than that of silicon oxide film (having a specific dielectric constant of 3.9 to 4.5) used for reducing the capacitance between the multilayer interconnects that connect the semiconductor elements to each other. In particular, the porous insulating film includes, for example, a material obtained by making porous a silicon oxide film to thereby reduce the specific dielectric constant, or a material obtained by making porous a hydrogen silsesquioxane (HSQ) film or an organic silica film, SiOC (for example, Black Diamond™, CORAL™, Aurora™) and the like to thereby reduce the specific dielectric constant, and the like. It is preferable to make lower the low-dielectric constants of these films.

In the embodiment, the metal interconnect material contains Cu as a main ingredient. In order to improve the reliability of the metal interconnect material, a metal element other than Cu may be contained in a member made of Cu, and a metal element other than Cu (for example, Al or Ni) may be formed on the upper surface or the lateral side and the like of Cu.

The term "damascene interconnect" indicates a buried interconnect formed by burying a metal interconnect material in a trench of the insulating interlayer which is previously formed and removing the redundant metal other than the inside of the trench by, for example, the CMP and the like. When the damascene interconnect is form by Cu, the interconnect structure is generally used in which the lateral side and the outer circumference of the Cu interconnect is covered with a barrier metal, and the upper surface of the Cu interconnect is covered with an insulating barrier film.

The term "chemical mechanical polishing (CMP) method" is a method of planarizing the asperity of the wafer surface occurring during the process of the multilayer interconnect formation by bringing the asperity into contact with a polishing pad rotated while a polishing solution is caused to flow to the wafer surface and polishing it. In the interconnect formation by the damascene method, particularly, after a metal is buried in the interconnect trench or the via hole, the CMP method is used in order to obtain the planarized interconnect surface by removing the redundant metal portion.

The term "barrier metal" indicates a conductive film, having barrier properties, for coating the lateral side and the bottom of the interconnect in order to prevent the metal elements included in the interconnect from being diffused to the insulating interlayer or the lower layer. For example, when the interconnect is made of the metal elements containing Cu as a main ingredient, high-melting-point metals such as tantalum (Ta), tantalum nitride (TaN), titanium nitride (TiN), and tungsten carbonitride (WCN) or the nitrides thereof and the like, or the laminated film thereof is used.

The "cap insulating film" indicates a film, formed on the upper surface of the Cu interconnect, which has a function of preventing the oxidation of Cu or the diffusion of Cu into the insulating film, and a role serving as an etching stopper layer at the time of processing. It is preferable to introduce an insulating barrier film having a lower-dielectric constant in order to improve the interconnect signal transmission delay. The cap insulating film is also called a barrier insulating film.

The term "semiconductor substrate" is a substrate in which a multilayer copper interconnect is formed, and particularly, includes not only a substrate created on a single-crystal silicon substrate, but also a substrate such as a silicon-on-insulator (SOI) substrate or a substrate for manufacturing a thin film transistor (TFT) and a liquid crystal.

The term "hard mask" indicates an insulating film having a role of protecting an insulating interlayer by laminating the hard mask on the insulating interlayer, when it is difficult to perform the CMP directly due to a decrease in the strength by the low-dielectric constant of the insulating interlayer.

The term "passivation film" is a film, formed on the uppermost layer of the semiconductor element, which has a role of protecting the semiconductor element from moisture and the like from the outside. A silicon oxynitride film (SiON) or a polymide film and the like, formed by a plasma CVD method, are generally used.

The term "plasma CVD method" is, for example, a method of continuously supplying a gaseous raw material to a reaction chamber under reduced pressure to change molecules to an excited state by plasma energy, and forming a continuous film on the substrate by gas phase reaction, or substrate surface reaction and the like.

The term "PVD method" is a method in which improvement of the burial characteristics, improvement of the film quality, or in-plane uniformity of the film thickness of the wafer is achieved, and then a sputtering method having a high directionality such as, for example, a long-throw sputtering method, a collimated sputtering method, or an ionized sputtering method normal can be used in addition to a normal sputtering method. When an alloy is sputtered, a metal other than the main component is previously contained within a metal target to the solid solubility limit or less, so that the formed metal film can be used as an alloy film. In the invention, the metal film can be used when a Cu seed layer or a Cu alloy seed layer at the time of chiefly forming a damascene Cu interconnect, and a barrier metal layer are formed.

It is apparent that the present invention is not limited to the above embodiment, and may be modified and changed without departing from the scope and spirit of the invention.

What is claimed is:

1. A method of manufacturing a semiconductor device, comprising:
   forming an insulating film, including Si and C, over a substrate;
   forming an organic silica film, having a composition ratio of the number of carbon atoms to the number of silicon atoms higher than that of said insulating film, over said insulating film; and
   forming two or more concave portions, having different opening diameters, in said organic silica film, by plasma processing in which mixed gas including inert gas, N-containing gas, fluorocarbon gas and oxidant gas is used.

2. The method of manufacturing a semiconductor device as set forth in claim 1, wherein the ratio of the flow rate of said N-containing gas to the flow rate of said inert gas is 1 or greater.

3. The method of manufacturing a semiconductor device as set forth in claim 1, wherein the ratio of the flow rate of said fluorocarbon gas to the flow rate of said oxidant gas is equal to or greater than 1 and equal to or less than 5.

4. The method of manufacturing a semiconductor device as set forth in claim 1, wherein said composition ratio of said organic silica film to said insulating film is 2 or greater.

5. The method of manufacturing a semiconductor device as set forth in claim 1, wherein said N-containing gas includes at least one selected from a group consisting of nitrogen gas, ammonia gas, and amine gas.

6. The method of manufacturing a semiconductor device as set forth in claim 1, wherein said fluorocarbon gas includes at least one selected from a group consisting of $CF_4$, $CHF_3$, $CH_2F_2$, $CHF_3$, $C_2F_6$, $C_2H_2F_4$, $C_2H_4F_2$, $C_2F_4$, $C_2H_2F_2$, $C_3F_8$, $C_3H_2F_6$, $C_3H_4F_4$, $C_3H_6F_2$, $C_3F_6$, $C_3HF_5$, $C_3H_3F_3$, $C_3H_4F_2$ or $C_3H_5F$.

7. The method of manufacturing a semiconductor device as set forth in claim 1, wherein said oxidant gas includes at least one selected from a group consisting of $O_2$, $CO_2$, $CH_3OH$, $C_2H_5OH$, $C_3H_7OH$, $N_2O$, $NO$, $N_2O_3$, $NO_2$, $N_2O_4$ and $N_2O_5$.

8. The method of manufacturing a semiconductor device as set forth in claim 1, wherein said insulating film includes SiC, SiCN, or SiOCN.

9. The method of manufacturing a semiconductor device as set forth in claim 1, wherein said organic silica film is a porous insulating film, and the average vacancy diameter of said porous insulating film is less than 1 nm.

10. The method of manufacturing a semiconductor device as set forth in claim 1, wherein said organic silica film includes a compound having a cyclic organosiloxane structure represented by the following General Formula (1):

[Formula 1]

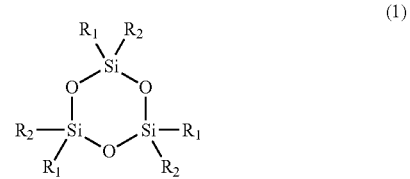

(where, R1 and R2 are the same or different, and denote a hydrocarbon group).

11. The method of manufacturing a semiconductor device as set forth in claim 10, wherein said compound having a cyclic organosiloxane structure is represented by the following Formula (2) or the following Formula (3):

[Formula 2]

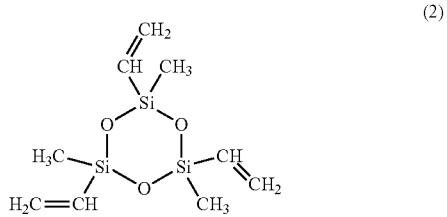

[Formula 3]

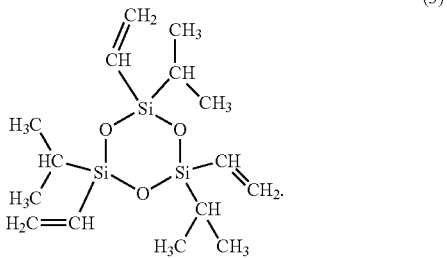

12. The method of manufacturing a semiconductor device as set forth in claim 1, wherein,
    in said forming an insulating film step, the insulating film is formed horizontally over the substrate, in said etching step, a ratio of the flow rate of said N-containing gas to the flow rate of said inert gas is selected to achieve a predetermined etching rate when forming the two or more concave portions, and the two or more concave portions are separate and horizontally spaced apart from each other.

13. A method of manufacturing a semiconductor device, comprising:

i) forming a lower-layer interconnect structure (1) constituted by a substrate (1a), horizontally spaced apart first and second Cu films (1c) within the substrate (1a), and a cap insulating film (1d) contacting the substrate (1a) and the Cu films (1c), the cap insulating film (id) including Si and C with a first composition ratio of carbon atoms to silicon atoms;

ii) sequentially forming an organic silica film (2) for an upper-layer interconnect over the cap insulating film (id), the organic silica film (2) having a second composition ratio of carbon atoms to silicon atoms, the second composition ratio being greater than the first composition ratio; and iii) plasma etching, at a predetermined etching rate, first via (5) and a second via (6) through the organic silica film (2) and into the cap insulating film (id) in vertical registration over the first and second Cu films (1c), the first via (5) being separate from the second via (6) and having an opening diameter different from an opening diameter of the columnar via, the first via (5) and the second via (6) being etched at a same time and at a same etching rate, a remaining thickness of the cap insulating film (id) being equal below the first via (5) and the second via (6), wherein said step of plasma etching in said organic silica film uses a mixed gas including Argon gas, N-containing gas, fluorocarbon gas, and an oxidant gas, wherein a ratio of the flow rate of said N-containing gas to the flow rate of said Argon gas is selected to achieve the predetermined etching rate, the ratio of the flow rate of said N-containing gas to the flow rate of said Argon gas being 1 or greater.

14. The method of manufacturing a semiconductor device as set forth in claim 1, wherein said step of forming two or more concave portions comprises:

forming an opening in said organic silica film; and forming an interconnect trench over the opening such that the interconnect trench and the opening in a direction of a thickness of the organic silica film together constitute one of the concave portions, wherein the interconnect trench has a width equal to or greater than a width of the opening in said organic silica film, as viewed in a cross section perpendicular to a longitudinal axis of the interconnect trench, and wherein the opening and the interconnect trench are both formed in a single layer of the organic silica film.

15. The method of manufacturing a semiconductor device as set forth in claim 14, wherein the width of the interconnect trench is greater than a width of the opening in said organic silica film, as viewed in the cross section perpendicular to the longitudinal axis of the interconnect trench.

* * * * *